(12) United States Patent
Xu et al.

(10) Patent No.: US 12,062,646 B2
(45) Date of Patent: *Aug. 13, 2024

(54) SLICING MICRO-LED WAFER AND SLICING MICRO-LED CHIP

(71) Applicant: JADE BIRD DISPLAY (SHANGHAI) LIMITED, Shanghai (CN)

(72) Inventors: Qunchao Xu, Shanghai (CN); Qiming Li, Albuquerque, NM (US)

(73) Assignee: JADE BIRD DISPLAY (SHANGHAI) LIMITED, Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/346,325

(22) Filed: Jul. 3, 2023

(65) Prior Publication Data

US 2023/0343763 A1 Oct. 26, 2023

Related U.S. Application Data

(63) Continuation of application No. 17/155,518, filed on Jan. 22, 2021, now Pat. No. 11,710,725.

(51) Int. Cl.
*H01L 25/075* (2006.01)
*H01L 27/12* (2006.01)
*H01L 33/58* (2010.01)
*H01L 33/62* (2010.01)

(52) U.S. Cl.
CPC ...... *H01L 25/0753* (2013.01); *H01L 27/1214* (2013.01); *H01L 33/58* (2013.01); *H01L 33/62* (2013.01)

(58) Field of Classification Search
CPC . H01L 25/0753; H01L 27/1214; H01L 33/58; H01L 33/62; H01L 25/167; H01L 21/7806; H01L 33/007
See application file for complete search history.

(56) References Cited

U.S. PATENT DOCUMENTS

| 11,710,725 B2* | 7/2023 | Xu | H01L 27/1214 |
| | | | 257/89 |
| 2019/0115334 A1* | 4/2019 | Zhang | H01L 33/58 |
| 2020/0235085 A1 | 7/2020 | Tao et al. | |
| 2020/0251638 A1 | 8/2020 | Morris et al. | |
| 2021/0343567 A1* | 11/2021 | Han | H01L 21/6835 |

FOREIGN PATENT DOCUMENTS

| CN | 108735865 A | 11/2018 |
| CN | 110610931 A | 12/2019 |
| CN | 110993761 A | 4/2020 |
| CN | 111048497 A | 4/2020 |
| CN | 111769103 A | 10/2020 |

OTHER PUBLICATIONS

International Search Report and Written Opinion of International Application No. PCT/IB2022/050444, mailed May 6, 2022.

* cited by examiner

*Primary Examiner* — Victor A Mandala
(74) *Attorney, Agent, or Firm* — FINNEGAN, HENDERSON, FARABOW, GARRETT & DUNNER LLP

(57) ABSTRACT

A slicing micro-light emitting diode (LED) wafer includes a driver circuit substrate, a plurality of micro-LEDs formed on the driver circuit substrate, the plurality of micro-LEDs being made from a plurality of epitaxial layer slices arranged side-by-side on the driver circuit substrate, and a bonding layer, formed at bottoms of the plurality of epitaxial layer slices and on a top surface of the driver circuit substrate, for bonding the micro-LEDs and the driver circuit substrate.

19 Claims, 14 Drawing Sheets

US 12,062,646 B2

SLICING MICRO-LED WAFER AND SLICING MICRO-LED CHIP

FIELD OF THE DISCLOSURE

The present disclosure generally relates to a micro-light emitting diode (LED) chip and, more particularly, to a micro-LED chip made from a slicing micro-LED wafer.

BACKGROUND

A light emitting diode (LED), which is a kind of semiconductor diode, can convert electrical energy into optical energy, and emit light having different colors depending on a material of a light emitting layer included in the LED.

A process of forming an LED chip includes stacking a plurality of epitaxial layers used as light emitting layers on a substrate, and then forming a plurality of LEDs from the stack of epitaxial layers. Such process may require a complicated manufacturing process and a high manufacturing cost.

SUMMARY

According to one embodiment of the present disclosure, a slicing micro-light emitting diode (LED) wafer is provided. The slicing micro-LED wafer includes a driver circuit substrate, a plurality of micro-LEDs formed on the driver circuit substrate, the plurality of micro-LEDs being made from a plurality of epitaxial layer slices arranged side-by-side on the driver circuit substrate, and a bonding layer, formed at bottoms of the plurality of epitaxial layer slices and on a top surface of the driver circuit substrate, for bonding the micro-LEDs and the driver circuit substrate.

DETAILED DESCRIPTION

Reference will now be made in detail to the present embodiments, examples of which are illustrated in the accompanying drawings. Wherever possible, the same reference numbers will be used throughout the drawings to refer to the same or like parts.

According to embodiments of the present disclosure, a slicing wafer is formed by bonding a plurality of epitaxial layer slices on a driver circuit wafer. Then, the slicing wafer is processed to form a plurality of micro-light emitting diode (LED) chips.

FIGS. 1A to 10B schematically illustrate structures formed in a process of forming a micro-light emitting diode (LED) chip, consistent with an embodiment of the present disclosure.

Figure 1A:
FIGS. 1A, 1B, and 1C schematically illustrate cross-sectional views of first, second, and third epitaxial wafers, respectively, consistent with an embodiment of the present disclosure.
Figure 1B:
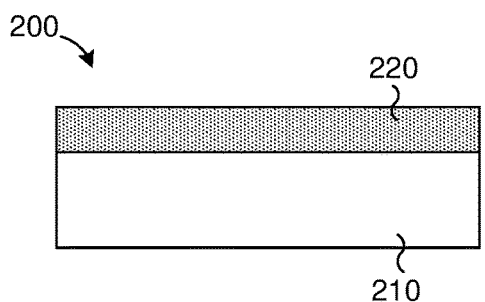
Figure 1C:
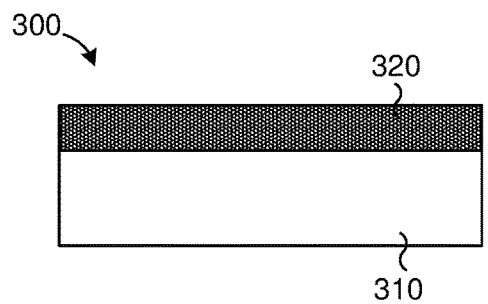
Figure 1D:
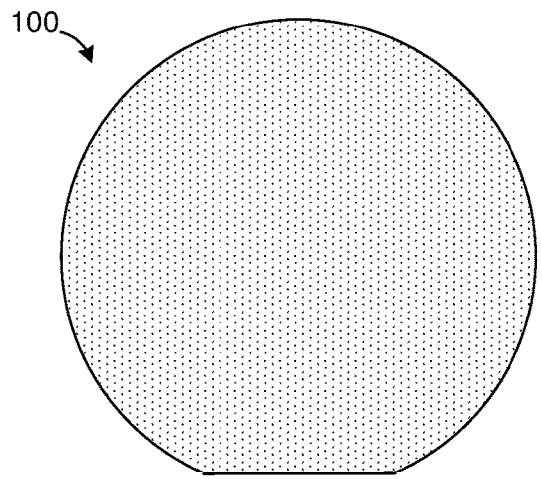
FIGS. 1D, 1E, and 1F schematically illustrate top views of the first, second, and third epitaxial wafers illustrated in FIGS. 1A, 1B, and 1C, respectively, consistent with an embodiment of the present disclosure.
Figure 1E:
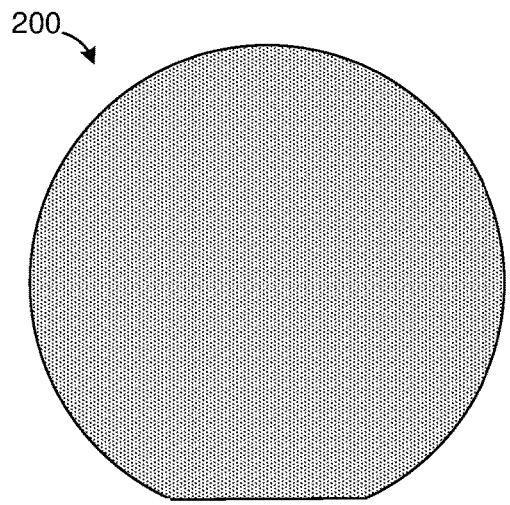
Figure 1F:
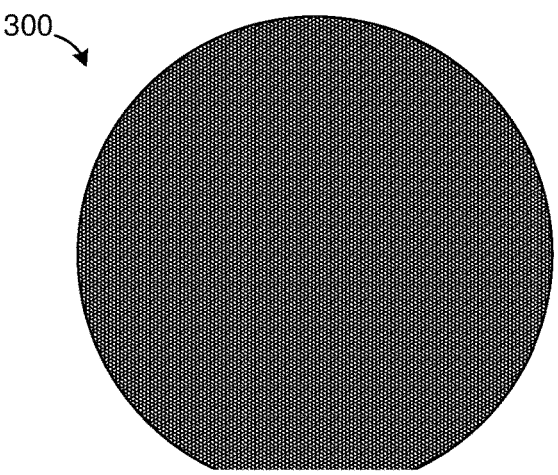

First, as shown in FIGS. 1A-1F, a first epitaxial wafer 100, a second epitaxial wafer 200, and a third epitaxial wafer 300 are formed. FIGS. 1A, 1B, and 1C schematically illustrate cross-sectional views of first, second, and third epitaxial wafers 100, 200, and 300, respectively. FIGS. 1D, 1E, and 1F schematically illustrate top views of first, second, and third epitaxial wafers 100, 200, and 300, respectively.

As shown in FIGS. 1A and 1D, first epitaxial wafer 100 includes a first growth substrate 110 and a first epitaxial layer 120 epitaxially grown on first growth substrate 110. As shown in FIGS. 1B and 1E, second epitaxial wafer 200 includes a second growth substrate 210 and a second epitaxial layer 220 epitaxially grown on second growth substrate 210. As shown in FIGS. 1C and 1F, third epitaxial wafer 300 includes a third growth substrate 310 and a third epitaxial layer 320 epitaxially grown on third growth substrate 310.

First, second, and third epitaxial layers 120, 220, and 320 may have the same size and same shape. Each one of first, second, and third epitaxial layers 120, 220, and 320 includes an epitaxial structure that is suitable for forming light emitting diodes. For example, each one of first, second, and third epitaxial layers 120, 220, and 320 may include an opto-electronic device epi-structure layer, such as an LED epi-structure layer, a VCSEL (vertical cavity surface emitting laser) epi-structure layer, or a photodetector epi-structure layer, etc.

Each one of first, second, and third epitaxial layers 120, 220, and 320 can, when applied with a voltage, emit light having a certain color. For example, first epitaxial layer 120 may emit red light, second epitaxial layer 220 may emit green light, and third epitaxial layer 320 may emit blue light. As another example, first epitaxial layer 120 may emit yellow light, second epitaxial layer 220 may emit orange light, and third epitaxial layer 320 may emit cyan light. The present disclosure does not limit the color of the light emitted by first, second, and third epitaxial layers 120, 220, and 320.

Each one of first, second, and third growth substrates 110, 210, and 310 can be any substrate that is suitable for the epitaxial growth of first, second, and third epitaxial layers 120, 220, and 320, respectively. For example, if any one of first, second, and third epitaxial layers 120, 220, and 320 includes a GaN-based material, the corresponding growth substrate 110, 210, or 310 can be a sapphire substrate, such as a patterned sapphire substrate, or can be a SiC substrate. As another example, if any one of first, second, and third epitaxial layers 120, 220, and 320 includes an InP-based material, the corresponding growth substrate 110, 210, or 310 can be an InP substrate. As a further example, if any one of first, second, and third epitaxial layers 120, 220, and 320 includes a GaAs-based material, the corresponding growth substrate 110, 210, or 310 can be a GaAs substrate.

Figure 2A:
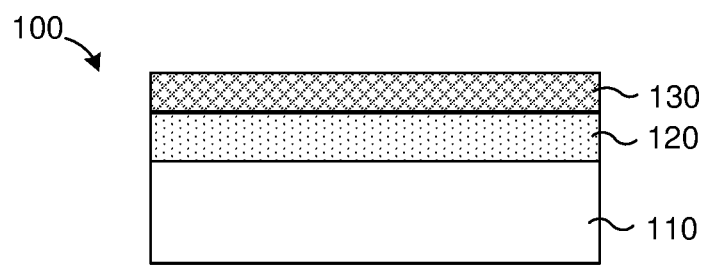
FIGS. 2A, 2B, and 2C schematically illustrate cross-sectional views of the first, second, and third epitaxial wafers, respectively, after first, second, and third epitaxial pre-bonding layers are formed, consistent with an embodiment of the present disclosure.
Figure 2B:
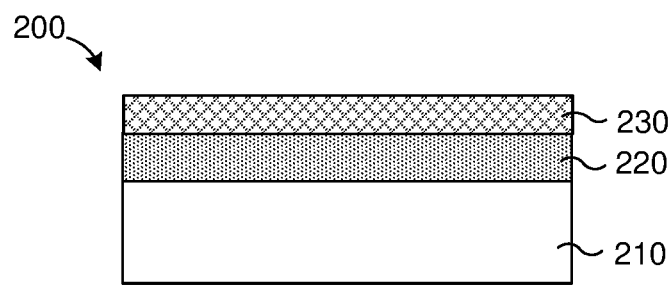
Figure 2C:
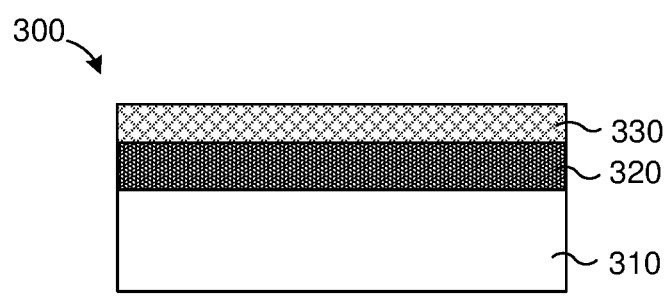

Next, as shown in FIGS. 2A, 2B, and 2C, a first epitaxial pre-bonding layer 130, a second epitaxial pre-bonding layer 230, and a third epitaxial pre-bonding layer 330 are formed on first epitaxial wafer 100, second epitaxial wafer 200, and third epitaxial wafer 300, respectively. Specifically, FIGS. 2A, 2B, and 2C are cross-sectional views of first epitaxial wafer 100, second epitaxial wafer 200, and third epitaxial wafer 300, respectively, after first epitaxial pre-bonding layer 130, second epitaxial pre-bonding layer 230, and third epitaxial pre-bonding layer 330 are formed. As shown in FIG. 2A, first epitaxial pre-bonding layer 130 is formed on top of first epitaxial layer 120. As shown in FIG. 2B, second epitaxial pre-bonding layer 230 is formed on top of second epitaxial layer 220. As shown in FIG. 2C, third epitaxial pre-bonding layer 330 is formed on top of first epitaxial layer 320.

Each one of first, second, and third epitaxial pre-bonding layers 130, 230, and 330 can include a bonding material sublayer containing one or more bonding materials such as, for example, Sn, Au, Ni, Pd, or Cu, or an alloy thereof. The bonding material sublayer may also include a multi-layer structure having a plurality of layers of one or more bonding materials. In some embodiments, each one of first, second, and third epitaxial pre-bonding layers 130, 230, and 330 can also include an adhesion sublayer and/or a bonding diffusion barrier sublayer formed between the bonding material sublayer and the underlying first, second, or third epitaxial layer 120, 220, or 320. The adhesion sublayer is configured to enhance adhesion between the bonding material sublayer and first, second, or third epitaxial layer 120, 220, or 320. The bonding diffusion barrier sublayer is configured to prevent or reduce diffusion of the bonding material(s) into first, second, or third epitaxial layer 120, 220, or 320.

Figure 3A:
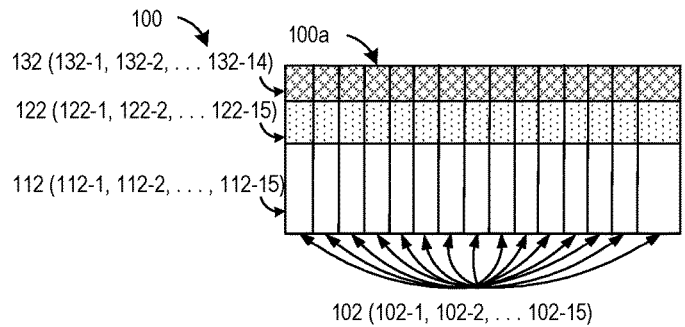
FIGS. 3A, 3B, and 3C schematically illustrate cross-sectional views of the first, second, and third epitaxial wafers after slicing, respectively, consistent with an embodiment of the present disclosure.
Figure 3B:
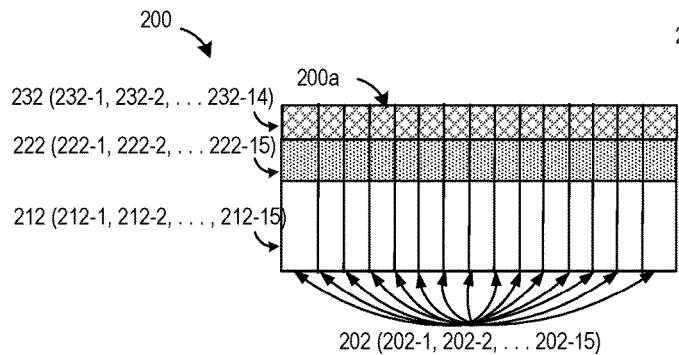
Figure 3C:
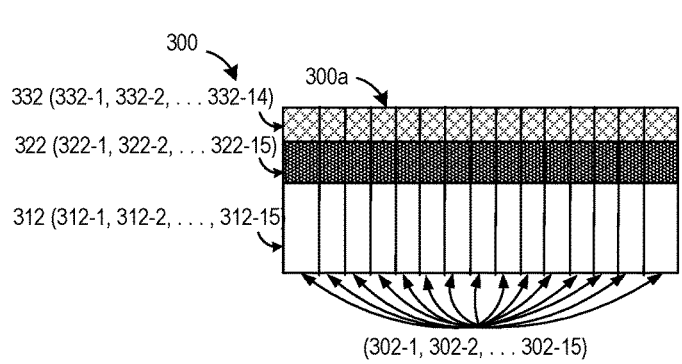
Figure 3D:
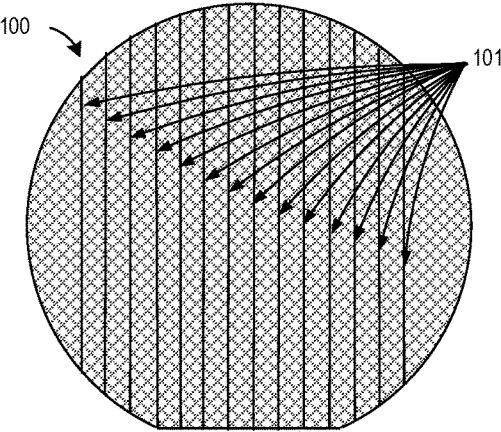
FIGS. 3D, 3E, and 3F schematically illustrate top views of the first, second, and third epitaxial wafers illustrated in FIGS. 3A, 3B, and 3C, respectively, consistent with an embodiment of the present disclosure.
Figure 3E:
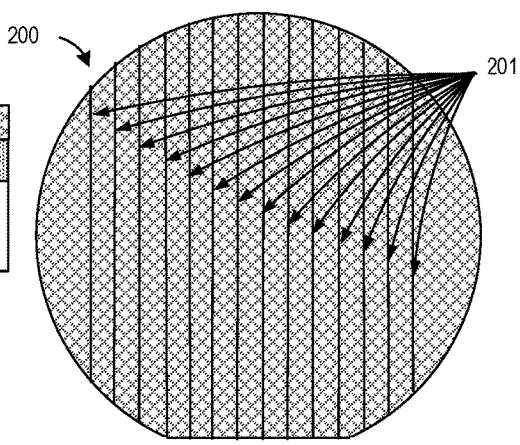
Figure 3F:
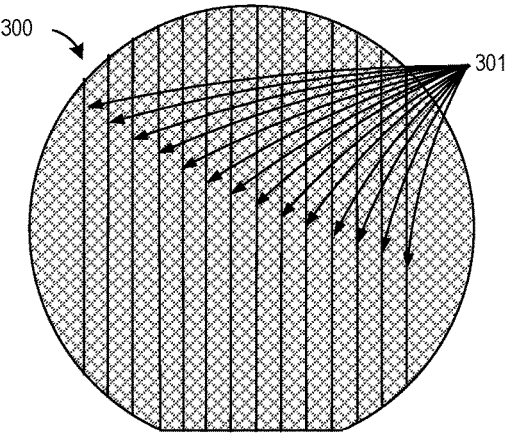

As shown in FIGS. 3A-3F, each one of first, second, and third epitaxial wafers 100, 200, and 300 is sliced into slices. FIGS. 3A, 3B, and 3C schematically illustrate cross-sectional views of first, second, and third epitaxial wafers 100, 200, and 300 after slicing, respectively. FIGS. 3D, 3E, and 3F schematically illustrate top views of first, second, and third epitaxial wafers 100, 200, and 300 after slicing, respectively.

As shown in FIGS. 3A and 3D, first epitaxial wafer 100 is sliced along a plurality of first slicing lines 101 arranged on a top surface 100a of first epitaxial wafer 100, and parallel to each other. First slicing lines 101 may be, or may not be, equally spaced apart from each other. The slicing of first epitaxial wafer 100 may be performed by means of laser cutting, or cutting by a wire saw or a diamond-coated inside diameter saw, or by cleaving. As a result, first epitaxial wafer 100 is sliced into a plurality of first epitaxial wafer slices 102 (102-1, 102-2, . . . 102-15). More particularly, first growth substrate 110 is sliced into a plurality of first growth substrate slices 112 (112-1, 112-2, . . . 112-15); first epitaxial layer 120 is sliced into a plurality of first epitaxial layer slices 122 (122-1, 122-2, . . . 122-15); and first epitaxial pre-bonding layer 130 is sliced into a plurality of first epitaxial pre-bonding layer slices 132 (132-1, 132-2, . . . 132-15). Accordingly, each one of first epitaxial wafer slices 102 includes one of the plurality of first growth substrate slices 112, one of the plurality of first epitaxial layer slices 122, and one of the plurality of first epitaxial pre-bonding layer slices 132. Although FIGS. 3A and 3D illustrate that first epitaxial wafer 100 is sliced into fifteen (15) first epitaxial wafer slices 102, the present disclosure is not so limited. The number of first epitaxial wafer slices 102 may be adjusted according to actual application.

As shown in FIGS. 3B and 3E, second epitaxial wafer 200 is sliced along a plurality of second slicing lines 201 arranged on a top surface 200a of second epitaxial wafer 200, and parallel to each other. Second slicing lines 201 may be, or may not be, equally spaced apart from each other. The positions of second slicing lines 201 relative to second epitaxial wafer 200 and the spacing between second slicing lines 201 are the same as the positions of first slicing lines 101 relative to first epitaxial wafer 100 and the spacing between first slicing lines 101, respectively. The slicing of second epitaxial wafer 200 may be performed in a manner similar to that of first epitaxial wafer 100. As a result, second epitaxial wafer 200 is sliced into a plurality of second epitaxial wafer slices 202 (202-1, 202-2, . . . 202-15). More particularly, second growth substrate 210 is sliced into a plurality of second growth substrate slices 212 (212-1, 212-2, . . . 212-15); second epitaxial layer 220 is sliced into a plurality of second epitaxial layer slices 222 (222-1, 222-2, . . . 222-15); and second epitaxial pre-bonding layer 230 is sliced into a plurality of second epitaxial pre-bonding layer slices 232 (232-1, 232-2, . . . 232-15). Accordingly, each one of second epitaxial wafer slices 202 includes one of the plurality of second growth substrate slices 212, one of the plurality of second epitaxial layer slices 222, and one of the plurality of second epitaxial pre-bonding layer slices 232. Although FIGS. 3B and 3E illustrate that second epitaxial wafer 200 is sliced into fifteen (15) second epitaxial wafer slices 202, the present disclosure is not so limited. The number of second epitaxial wafer slices 202 may be adjusted according to actual application.

As shown in FIGS. 3C and 3F, third epitaxial wafer 300 is sliced along a plurality of third slicing lines 301 arranged on a top surface 300a of third epitaxial wafer 200, and parallel to each other. Third slicing lines 301 may be, or may not be, equally spaced apart from each other. The positions of third slicing lines 301 relative to third epitaxial wafer 300 and the spacing between second slicing lines 201 are the same as the positions of first slicing lines 101 relative to first epitaxial wafer 100 and the spacing between first slicing lines 101, respectively. The slicing of third epitaxial wafer 300 may be performed in a manner similar to that of first epitaxial wafer 100. As a result, third epitaxial wafer 300 is sliced into a plurality of third epitaxial wafer slices 302 (302-1, 302-2, . . . 302-15). More particularly, third growth substrate 310 is sliced into a plurality of third growth substrate slices 312 (312-1, 312-2, . . . 312-15); third epitaxial layer 320 is sliced into a plurality of third epitaxial layer slices 322 (322-1, 322-2, . . . 322-15); and third epitaxial pre-bonding layer 330 is sliced into a plurality of third epitaxial pre-bonding layer slices 332 (332-1, 332-2, . . . 332-15). Accordingly, each one of third epitaxial wafer slices 302 includes one of the plurality of third growth substrate slices 312, one of the plurality of third epitaxial layer slices 322, and one of the plurality of third epitaxial pre-bonding layer slices 332. Although FIGS. 3C and 3F illustrate that third epitaxial wafer 300 is sliced into fifteen (15) third epitaxial wafer slices 302, the present disclosure is not so limited. The number of third epitaxial wafer slices 302 may be adjusted according to actual application.

In the embodiment shown in FIGS. 1A-3F, first, second, and third epitaxial pre-bonding layers 130, 230, and 330 are formed before first, second, and third epitaxial wafers 100, 200, and 300 are sliced. In some alternative embodiments, first, second, and third epitaxial pre-bonding layers 130, 230, and 330 may be formed after first, second, and third epitaxial wafers 100, 200, and 300 are sliced. That is, epitaxial pre-bonding layers are formed on top of each one of first, second, and third epitaxial wafer slices 102, 202, and 302.

Figure 4A:
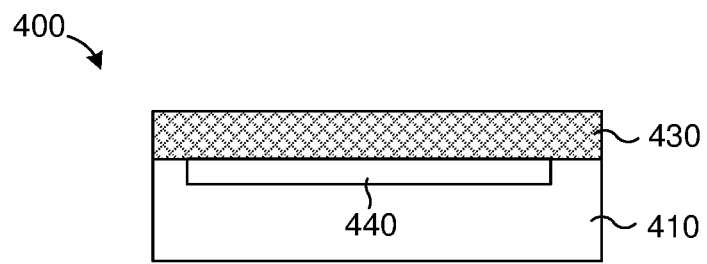
FIGS. 4A, 4B, and 4C schematically illustrate cross-sectional views of first, second, and third driver circuit wafers, respectively, consistent with an embodiment of the present disclosure.
Figure 4B:
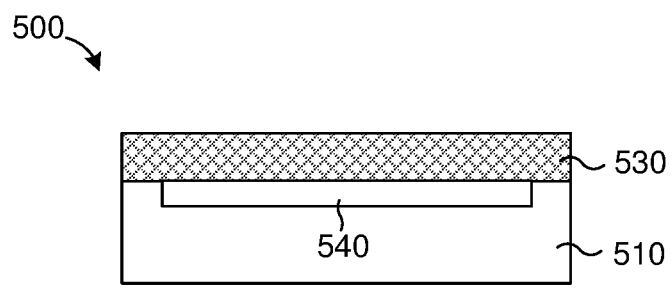
Figure 4C:
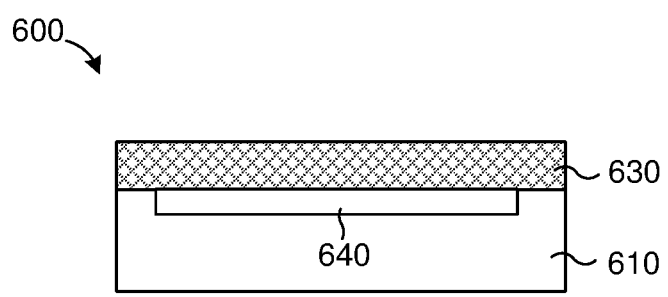

As shown in FIGS. 4A, 4B, and 4C, a first driver circuit wafer 400, a second driver circuit wafer 500, and a third driver circuit wafer 600 are formed. FIGS. 4A, 4B, and 4C schematically illustrate cross-sectional views of first, second, and third driver circuit wafers 400, 500, and 600, respectively.

Specifically, as shown in FIG. 4A, first driver circuit wafer 400 includes a first driver circuit substrate 410, a first driver circuit 440 formed on first driver circuit substrate 410, and a first driver circuit pre-bonding layer 430 formed over first driver circuit substrate 410 including first driver circuit 440. As shown in FIG. 4B, second driver circuit wafer 500 includes a second driver circuit substrate 510, a second driver circuit 540 formed on second driver circuit substrate 510, and a second driver circuit pre-bonding layer 530 formed over second driver circuit substrate 510 including second driver circuit 540. As shown in FIG. 4C, third driver circuit wafer 600 includes a third driver circuit substrate 610, a third driver circuit 640 formed on third driver circuit substrate 610, and a third driver circuit pre-bonding layer 630 formed over third driver circuit substrate 610 including third driver circuit 640.

Each one of first, second, and third driver circuit substrates 410, 510, and 610 can include a semiconductor substrate, such as an amorphous semiconductor substrate, a polycrystalline semiconductor substrate, or a single crystalline semiconductor substrate. For example, each one of first, second, and third driver circuit substrates 410, 510, and 610 can include a single crystalline silicon (Si) substrate or a single crystalline III-V compound semiconductor substrate. In some embodiments, each one of first, second, and third driver circuit substrates 410, 510, and 610 may include one or more dielectric layers (not shown), such as silicon dioxide ($SiO_2$) layers, formed over the semiconductor substrate. Wiring and/or contacts of first, second, or third driver circuit 440, 540, or 640 can be formed in or over the one or more dielectric layers.

Depending on the type of micro-LED chip to be formed, each one of first, second, and third driver circuits 440, 540, and 640 may include different types of devices. For example, each of first, second, and third driver circuits 440, 540, and 640 may include a single semiconductor device such as a metal-oxide-semiconductor field-effect transistor (MOSFET), a thin-film-transistor (TFT), a high-electron-mobility transistor (HEMT), a heterojunction bipolar transistor (HBT), a metal-semiconductor FET (MESFET), or a metal-insulator-semiconductor FET (MISFET), or an integrated circuit including two or more of any type of the above-listed devices.

In FIGS. 4A, 4B, and 4C, each one of first, second, and third driver circuits 440, 540, or 640 is diagrammatically illustrated as a single block. However, each one of first, second, and third driver circuits 440, 540, or 640 can include multiple components such as contacts and different material layers. Moreover, the micro-LED chip consistent with the embodiments of the present disclosure also includes other components, such as wiring, isolation layers, and/or passivation layers, which may be part of, or components in addition to, first, second, or third driver circuit wafer 400, 500, or 600, and/or first, second, or third epitaxial wafer 100, 200, or 300. These other components are not explicitly illustrated in the drawings of the present disclosure.

Each one of first, second, and third driver circuit pre-bonding layers 430, 530, and 630 can include a bonding material sublayer containing one or more bonding materials such as, for example, Sn, Au, Ni, Pd, or Cu, or an alloy thereof. The bonding material sublayer may also include a multi-layer structure having a plurality of layers of one or more bonding materials. In some embodiments, each one of first, second, and third driver circuit pre-bonding layers 430, 530, and 630 can also include an adhesion sublayer and/or a bonding diffusion barrier sublayer formed between the bonding material sublayer and the underlying first, second, or third driver circuit substrate 410, 510, or 610. The adhesion sublayer is configured to enhance the adhesion between the bonding material sublayer and the underlying first, second, or third driver circuit substrate 410, 510, or 610. The bonding diffusion barrier sublayer is configured to prevent or reduce diffusion of the bonding material(s) into first, second, or third driver circuit substrate 410, 510, or 610.

Figure 5A:
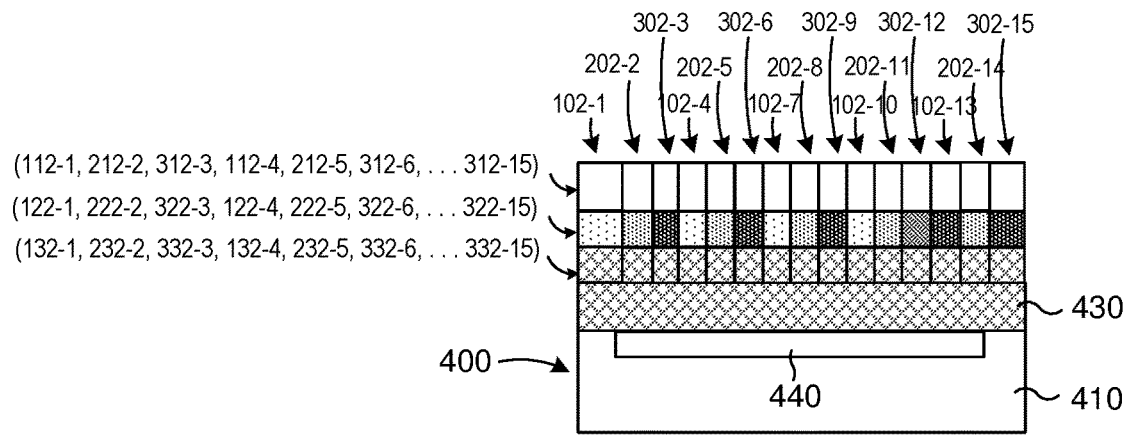
FIGS. 5A, 5B, and 5C schematically illustrate cross-sectional views of the first, second, and third driver circuit wafers formed with subsets of first epitaxial wafer slices, subsets of second epitaxial wafer slices, and subsets of third epitaxial wafer slices, respectively, consistent with an embodiment of the present disclosure.
Figure 5B:
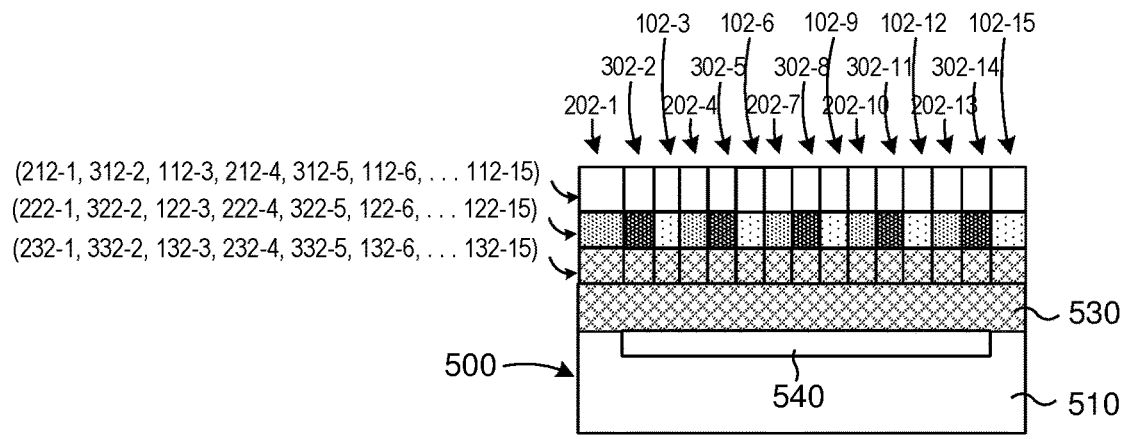
Figure 5C:
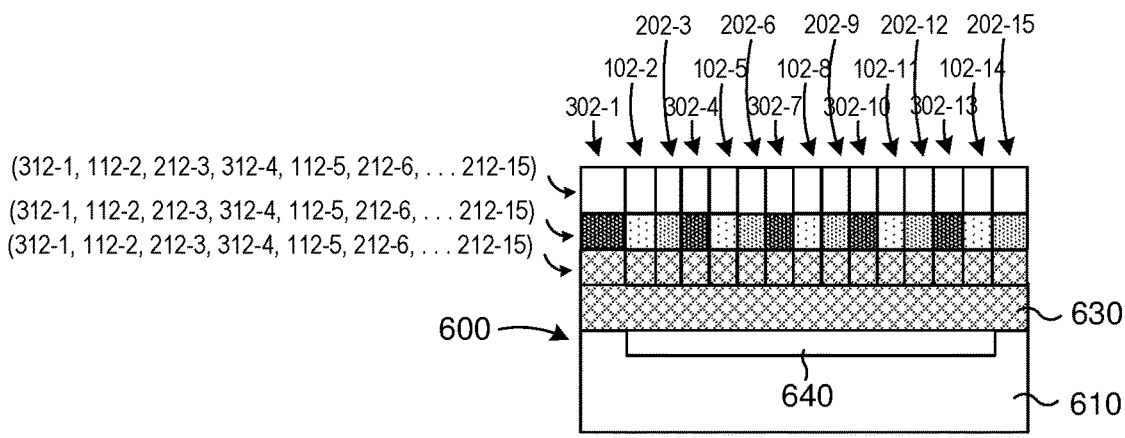

FIGS. 5A, 5B, and 5C schematically illustrate cross-sectional views of first, second, and third driver circuit wafers 400, 500, and 600 formed with subsets of first epitaxial wafer slices 102 (102-1, 102-2, . . . 102-15), subsets of second epitaxial wafer slices 202 (202-1, 202-2, . . . 202-15), and subsets of third epitaxial wafer slices 302 (302-1, 302-2, . . . 302-15), respectively, consistent with an embodiment of the present disclosure. As shown in FIGS.

5A, 5B, and 5C, first, second, and third epitaxial wafer slices 102 (102-1, 102-2, . . . 102-15), 202 (202-1, 202-2, . . . 202-15), and 302 (302-1, 302-2, . . . 302-15) are selectively transferred over and aligned with first, second, and third driver circuit wafers 400, 500, and 600, with first, second, and third epitaxial pre-bonding layer slices 132 (132-1, 132-2, . . . 132-15), 232 (232-1, 232-2, . . . 232-15), and 332 (332-1, 332-2, . . . 332-15) facing first, second, and third driver circuit pre-bonding layers 430, 530, and 630.

Specifically, FIG. 5A schematically illustrates a cross-sectional view of first driver circuit wafer 400 with a first subset of first epitaxial wafer slices 102 (102-1, 102-4, 102-7, 102-10, 102-13), a first subset of second epitaxial wafer slices 202 (202-2, 202-5, 202-8, 202-11, 202-14), and a first subset of third epitaxial wafer slices 302 (302-3, 302-6, 302-9, 302-12, 302-15) arranged on top thereof. FIG. 5B schematically illustrates a cross-sectional view of second driver circuit wafer 500 with a second subset of first epitaxial wafer slices 102 (102-3, 102-6, 102-9, 102-12, 102-15), a second subset of second epitaxial wafer slices 202 (202-1, 202-4, 202-7, 202-10, 202-13), and a second subset of third epitaxial wafer slices 302 (302-2, 302-5, 302-8, 302-11, 302-14) arranged on top thereof. FIG. 5C schematically illustrates a cross-sectional view of third driver circuit wafer 600 with a third subset of first epitaxial wafer slices 102 (102-2, 102-5, 102-8, 102-11, 102-14), a third subset of second epitaxial wafer slices 202 (202-3, 202-6, 202-9, 202-12, 202-15), and a third subset of third epitaxial wafer slices 302 (302-1, 302-4, 302-7, 302-10, 302-13) arranged on top thereof. The process of transferring the second subset or third subset of first, second, and third epitaxial wafer slices 102, 202, and 302 onto second driver circuit wafer 500 or third driver circuit wafer 600 is similar to that on first driver circuit wafer 400, and thus detailed description is provided below only for first driver circuit wafer.

Figure 6:
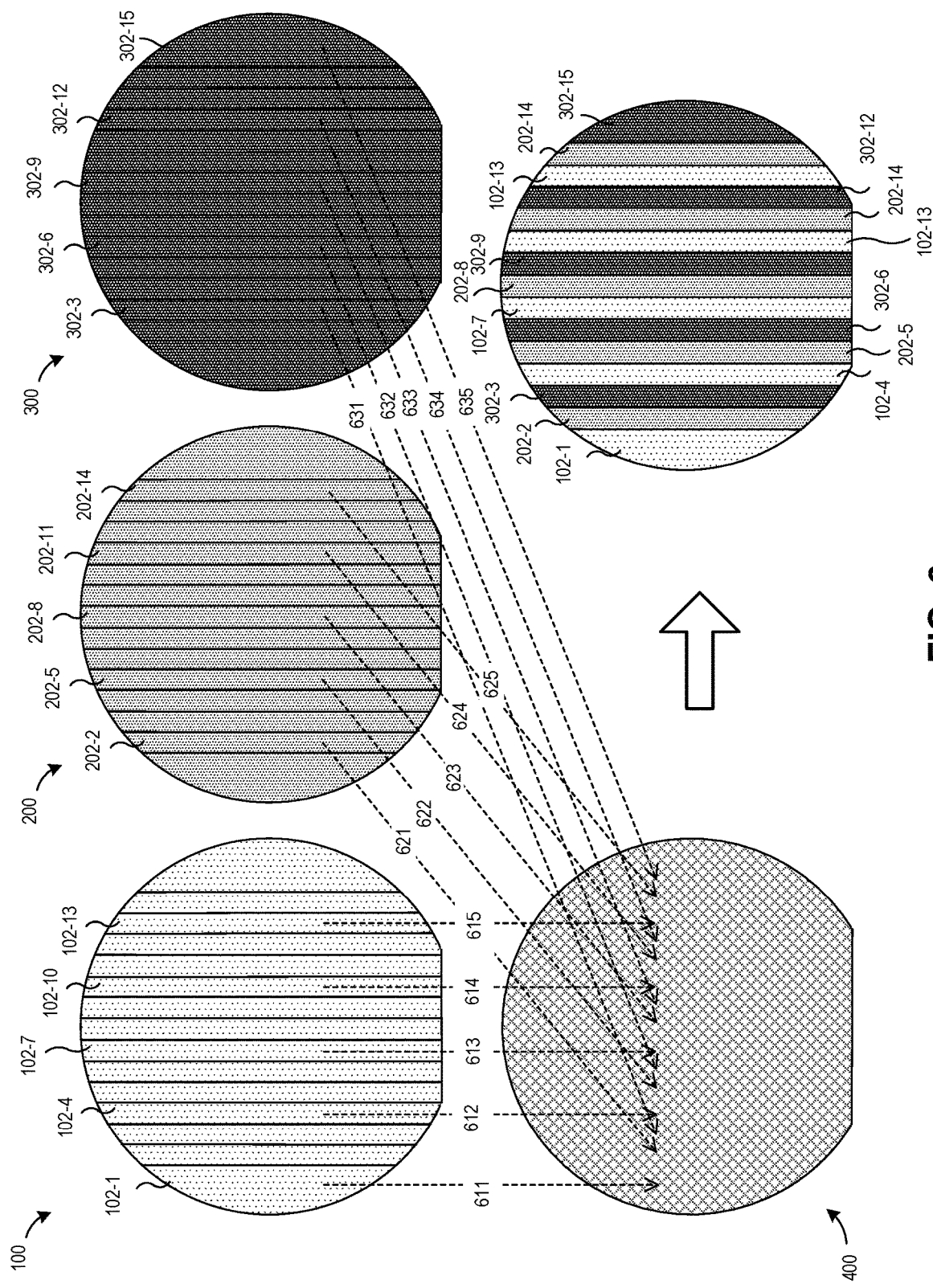
FIG. 6 schematically illustrates an arrangement of a subset of first epitaxial wafer slices, a subset of second epitaxial wafer slices, and a subset of third epitaxial wafer slices on top of the first driver circuit wafer, consistent with an embodiment of the present disclosure.

FIG. 6 schematically illustrates a process of transferring the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) onto first driver circuit wafer 400, consistent with an embodiment of the present disclosure. In particular, the three wafers in the upper row of FIG. 6 represent first, second, and third epitaxial wafers 100, 200, and 300, respectively; the lower left wafer in FIG. 6 represents first driver circuit wafer 400 before the transferring process; and the lower right wafer in FIG. 6 represents first driver circuit wafer 400 with the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) arranged on top thereof. In FIG. 6, for the purpose of differentiating first, second, and third epitaxial wafer slices 102 (102-1, 102-2, . . . 102-15), 202 (202-1, 202-2, . . . 202-15), and 302 (302-1, 302-2, . . . 302-15), first, second, and third epitaxial pre-bonding layer slices 132 (132-1, 132-2, . . . 132-15), 232 (232-1, 232-2, . . . 232-15), and 332 (332-1, 332-2, . . . 332-15) are not illustrated.

As shown in FIG. 6, the first subset of first epitaxial wafer slices 102 includes one of every three first epitaxial wafer slices 102 (102-1, 102-2, . . . 102-15). That is, the first subset of first epitaxial wafer slices 102 includes, starting from left (as viewed in FIG. 6), a first one of the plurality of first epitaxial wafer slices 102-1, a fourth one of the plurality of first epitaxial wafer slices 102-4, a seventh one of the plurality of first epitaxial wafer slices 102-7, a tenth one of the plurality of first epitaxial wafer slices 102-10, and a thirteenth one of the plurality of first epitaxial wafer slices 102-13. Similarly, the first subset of second epitaxial wafer slices 202 (202-1, 202-2, . . . 202-15) includes one of every three second epitaxial wafer slices 202. That is, the first subset of second epitaxial wafer slices 202 includes, starting from left (as viewed in FIG. 6), a second one of the plurality of second epitaxial wafer slices 202-2, a fifth one of the plurality of second epitaxial wafer slices 202-5, an eighth one of the plurality of second epitaxial wafer slices 202-8, an eleventh one of the plurality of second epitaxial wafer slices 202-11, and a fourteenth one of the plurality of second epitaxial wafer slices 202-14. Similarly, the first subset of third epitaxial wafer slices 302 (302-1, 302-2, . . . 302-15) includes one of every three third epitaxial wafer slices 302. That is, the first subset of third epitaxial wafer slices 302 includes, starting from left (as viewed in FIG. 6), a third one of the plurality of third epitaxial wafer slices 302-3, a sixth one of the plurality of third epitaxial wafer slices 302-6, a ninth one of the plurality of third epitaxial wafer slices 302-9, a twelfth one of the plurality of third epitaxial wafer slices 302-12, and a fifteenth one of the plurality of third epitaxial wafer slices 302-15.

The first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) are transferred along dotted lines 611, 612, . . . 615, 621, 622, . . . 625, 631, 632, . . . 635, respectively, to be alternately arranged on top of first driver circuit wafer 400, continuously following and succeeded by one another. For example, the first one of the plurality of first epitaxial wafer slices 102-1 is transferred along line 611 to be arranged on the left most position on first driver circuit wafer 400, and is adjacent to the second one of the plurality of second epitaxial wafer slices 202-2 transferred along line 621, which is adjacent to the third one of the plurality of third epitaxial wafer slices 302-3 transferred along line 631, and so on. The position of each one of epitaxial wafer slices 102 (102-1, 102-4, 102-7, 102-10, 102-13), 202 (202-2, 202-5, 202-8, 202-11, 202-14), or 302 (302-3, 302-6, 302-9, 302-12, 302-15), relative to first driver circuit wafer 400, is the same as the position of the epitaxial wafer slice 102 (102-1, 102-4, 102-7, 102-10, 102-13), 202 (202-2, 202-5, 202-8, 202-11, 202-14), or 302 (302-3, 302-6, 302-9, 302-12, 302-15) relative to its original epitaxial wafer 100, 200, or 300. For example, the position of the first one of the plurality of first epitaxial wafer slices 102-1 relative to first driver circuit wafer 400, is the same as the position of the first one of the plurality of first epitaxial wafer slices 102-1 relative to first epitaxial wafer 100; the position of the second one of the plurality of second epitaxial wafer slices 202-2 relative to first driver circuit wafer 400, is the same as the position of the second one of the plurality of second epitaxial wafer slices 202-2 relative to second epitaxial wafer 200; and so on.

Figure 7A:
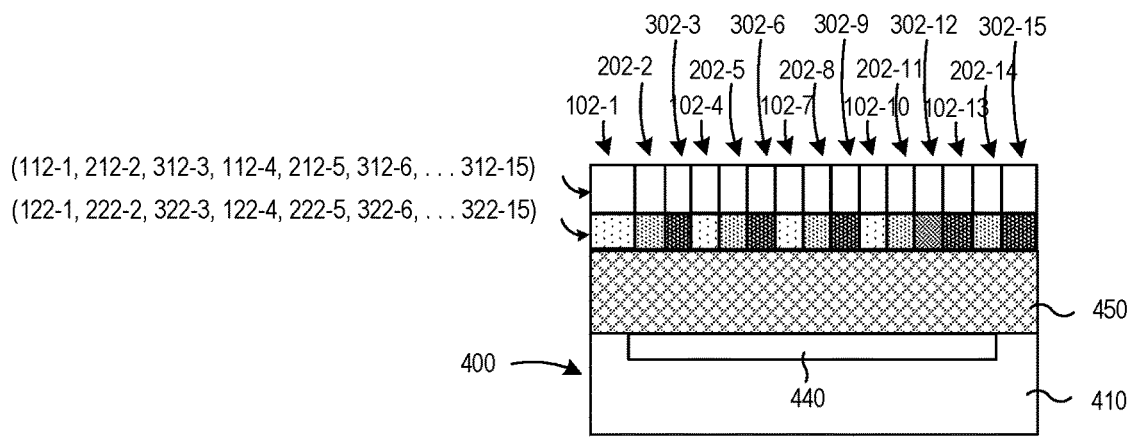
FIGS. 7A, 7B, and 7C schematically illustrate cross-sectional views of the first, second, and third driver circuit wafers bonded with the subset of first epitaxial wafer slices, a subset of second epitaxial wafer slices, and a subset of third epitaxial wafer slices, respectively, consistent with an embodiment of the present disclosure.
Figure 7B:
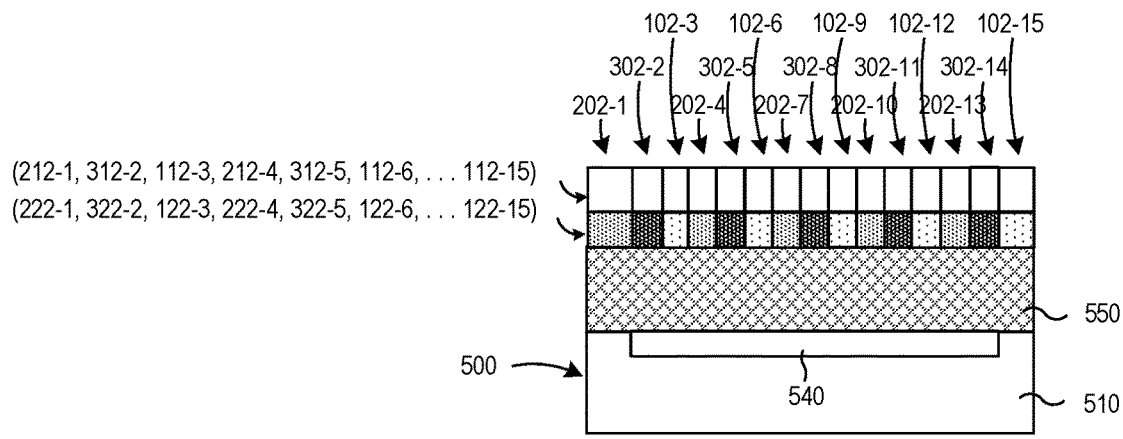
Figure 7C:
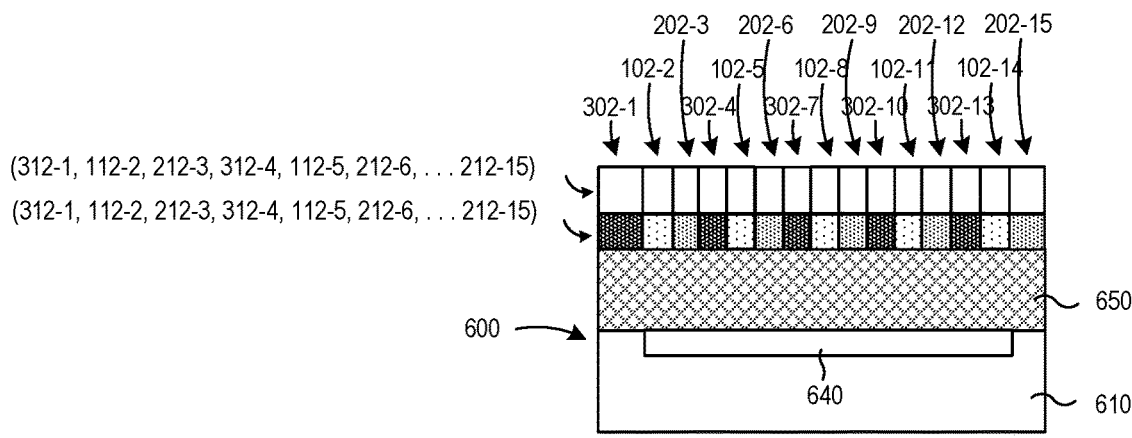

FIGS. 7A, 7B, and 7C schematically illustrate cross-sectional views of first, second, and third driver circuit wafers 400, 500, and 600 bonded with the subsets of first epitaxial wafer slices 102 (102-1, 102-2, . . . 102-15), the subsets of second epitaxial wafer slices 202 (202-1, 202-2, . . . 202-15), and the subsets of third epitaxial wafer slices 302 (302-1, 302-2, . . . 302-15), respectively, consistent with an embodiment of the present disclosure. As shown in FIGS. 7A, 7B, and 7C, first, second, and third epitaxial wafer slices 102 (102-1, 102-2, . . . 102-15), 202 (202-1, 202-2, . . . 202-15), and 302 (302-1, 302-2, . . . 302-15) are bonded with first, second, and third driver circuit wafers 400, 500, and 600 through pre-bonding layer slices 132 (132-1, 132-2, . . . 132-15), 232 (232-1, 232-2, . . . 232-15), 332 (332-1, 332-2, . . . 332-15) and prebonding layers 430, 530, and 630.

Specifically, FIG. 7A schematically illustrates a cross-sectional view of first driver circuit wafer 400 bonded with the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15). As shown in FIG. 7A, after the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) are alternately arranged on top of first driver circuit wafer 400, a bonding process is conducted to bond the first epitaxial pre-bonding layer slices 132 (132-1, 132-4, 132-7, 132-10, 132-13) in the first subset of first epitaxial wafer slices 102 (102-1, 102-4, 102-7, 102-10, 102-13), the second epitaxial pre-bonding layer slices 232 (232-2, 232-5, 232-8, 232-11, 232-14) in the first subset of second epitaxial wafer slices 202 (202-2, 202-5, 202-8, 202-11, 202-14), the third epitaxial pre-bonding layer slices 332 (332-3, 332-6, 332-9, 332-12, 332-15) in the first subset of third epitaxial wafer slices 302 (302-3, 302-6, 302-9, 302-12, 302-15), and first driver circuit pre-bonding layer 430 on first driver circuit wafer 400, to form an unpatterned bonding layer 450.

In some embodiments, the bonding process includes pressing the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) against first driver circuit pre-bonding layer 430 of first driver circuit wafer 400.

In some embodiments, the bonding process further includes heating at an elevated temperature such that at least a portion of first, second, and third epitaxial pre-bonding layer slices 132 (132-1, 132-4, 132-7, 132-10, 132-13), 232 (232-2, 232-5, 232-8, 232-11, 232-14), and 332 (332-3, 332-6, 332-9, 332-12, 332-15), and at least a portion of first driver circuit pre-bonding layer 430 melt, such that the first, second, and third epitaxial pre-bonding layer slices 132 (132-1, 132-4, 132-7, 132-10, 132-13), 232 (232-2, 232-5, 232-8, 232-11, 232-14), and 332 (332-3, 332-6, 332-9, 332-12, 332-15), and first driver circuit pre-bonding layer 430 are welded to each other to form bonding layer 450. The temperature at which the bonding process is conducted depends on the bonding material(s) used, and can, for example, range from about 230° C. to higher than 350° C. when an Au—Sn alloy is used as the bonding material. Other bonding techniques can also be applied as long as they can bond the first, second, and third epitaxial pre-bonding layer slices 132 (132-1, 132-4, 132-7, 132-10, 132-13), 232 (232-2, 232-5, 232-8, 232-11, 232-14), and 332 (332-3, 332-6, 332-9, 332-12, 332-15), and first driver circuit pre-bonding layer 430 together.

In some embodiments, before or after slicing first, second, and third epitaxial wafers 100, 200, and 300, or after first, second, and third epitaxial wafer slices 102 (102-1, 102-2, . . . 102-15), 202 (202-1, 202-2, . . . 202-15), and 302 (302-1, 302-2, . . . 302-15) are transferred over first, second, and third driver circuit substrates 400, 500, and 600: first, second, and third growth substrates 110, 210, and 310 or first, second, and third growth substrate slices 112 (112-1, 112-2, . . . 112-15), 212 (212-1, 212-2, . . . 212-15), and 312 (312-1, 312-2, . . . 312-15) may be thinned. The thinning may be performed so that the thicknesses of first, second, and third epitaxial wafer slices 102 (102-1, 102-2, . . . 102-15), 202 (202-1, 202-2, . . . 202-15), and 302 (302-1, 302-2, . . . 302-15) are the same, and the thicknesses of first, second, and third epitaxial layer slices 122 (122-1, 122-2, . . . 122-15), 222 (222-1, 222-2, . . . 222-15), and 322 (322-1, 322-2, . . . 322-15) are the same. As a result, when the first subset of first epitaxial wafer slices 102 (102-1, 102-4, 102-7, 102-10, 102-13), the first subset of second epitaxial wafer slices 202 (202-2, 202-5, 202-8, 202-11, 202-14), and the first subset of third epitaxial wafer slices 302 (302-3, 302-6, 302-9, 302-12, 302-15) are pressed against first driver circuit pre-bonding layer 430 of first driver circuit wafer 400 during the bonding process, first, second, and third epitaxial wafer slices 102, 202, and 302 can receive an even pressing force.

Similarly, FIG. 7B schematically illustrates a cross-sectional view of second driver circuit wafer 500 bonded with the second subset of first epitaxial wafer slices 102 (102-3, 102-6, 102-9, 102-12, 102-15), the second subset of second epitaxial wafer slices 202 (202-1, 202-4, 202-7, 202-10, 202-13), and the second subset of third epitaxial wafer slices 302 (302-2, 302-5, 302-8, 302-11, 302-14). As shown in FIG. 7B, a bonding process is conducted to bond the first epitaxial pre-bonding layer slices 132 (132-3, 132-6, 132-9, 132-12, 132-15) in the second subset of first epitaxial wafer slices 102 (102-3, 102-6, 102-9, 102-12, 102-15), the second epitaxial pre-bonding layer slices 232 (232-1, 232-4, 232-7, 232-10, 232-13) in the second subset of second epitaxial wafer slices 202 (202-1, 202-4, 202-7, 202-10, 202-13), the third epitaxial pre-bonding layer slices 332 (332-2, 332-5, 332-8, 332-11, 332-14) in the second subset of third epitaxial wafer slices 302 (302-2, 302-5, 302-8, 302-11, 302-14), and second driver circuit pre-bonding layer 530 on second driver circuit wafer 500, to form an unpatterned bonding layer 550.

FIG. 7C schematically illustrates a cross-sectional view of third driver circuit wafer 400 bonded with the third subset of first epitaxial wafer slices 102 (102-2, 102-5, 102-8, 102-11, 102-14), the third subset of second epitaxial wafer slices 202 (202-3, 202-6, 202-9, 202-12, 202-15), and the third subset of third epitaxial wafer slices 302 (302-1, 301-4, 302-7, 302-10, 302-13). As shown in FIG. 7C, a bonding process is conducted to bond the first epitaxial pre-bonding layer slices 132 (132-2, 132-5, 132-8, 132-11, 132-14) in the third subset of first epitaxial wafer slices 102 (102-2, 102-5, 102-8, 102-11, 102-14), the second epitaxial pre-bonding layer slices 232 (232-3, 232-6, 232-9, 232-12, 232-15) in the third subset of second epitaxial wafer slices 202 (202-3, 202-6, 202-9, 202-12, 202-15), the third epitaxial pre-bonding layer slices 332 (332-1, 331-4, 332-7, 332-10, 332-13) in the third subset of third epitaxial wafer slices 302 (302-1, 301-4, 302-7, 302-10, 302-13), and third driver circuit pre-bonding layer 630 on third driver circuit wafer 600, to form an unpatterned bonding layer 650.

The bonding processes performed on second driver circuit wafer 500 and third driver circuit wafer 600 are similar to the one performed on first driver circuit wafer 400, and thus detailed descriptions of these processes are not repeated.

Figure 8A:
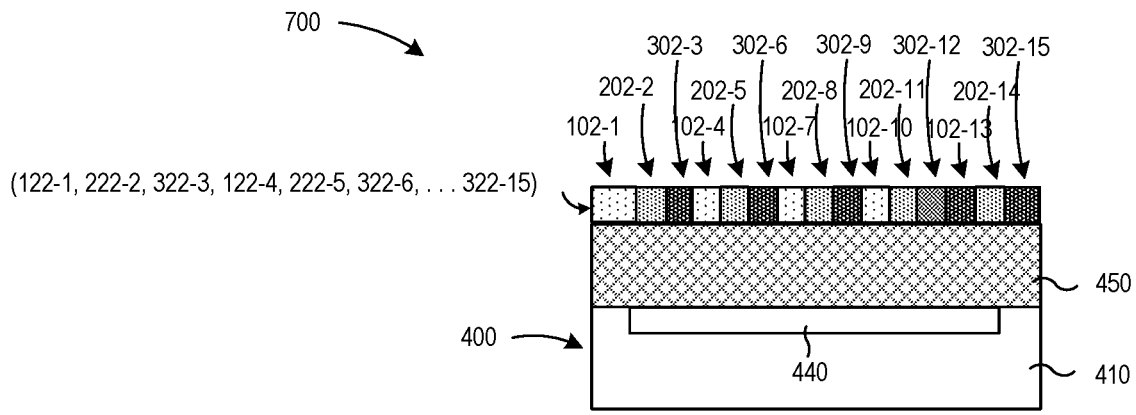
FIGS. 8A, 8B, and 8C schematically illustrate cross-sectional views of first, second, and third slicing wafers, respectively, consistent with an embodiment of the present disclosure.
Figure 8B:
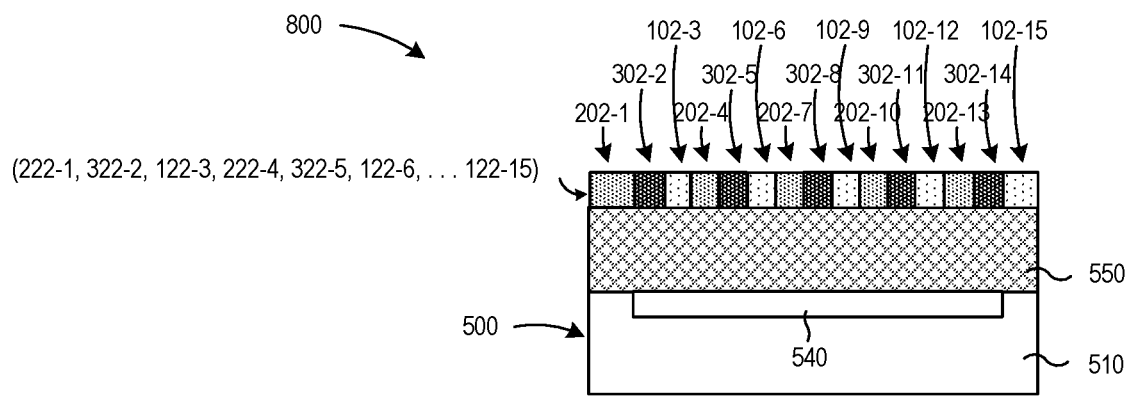
Figure 8C:
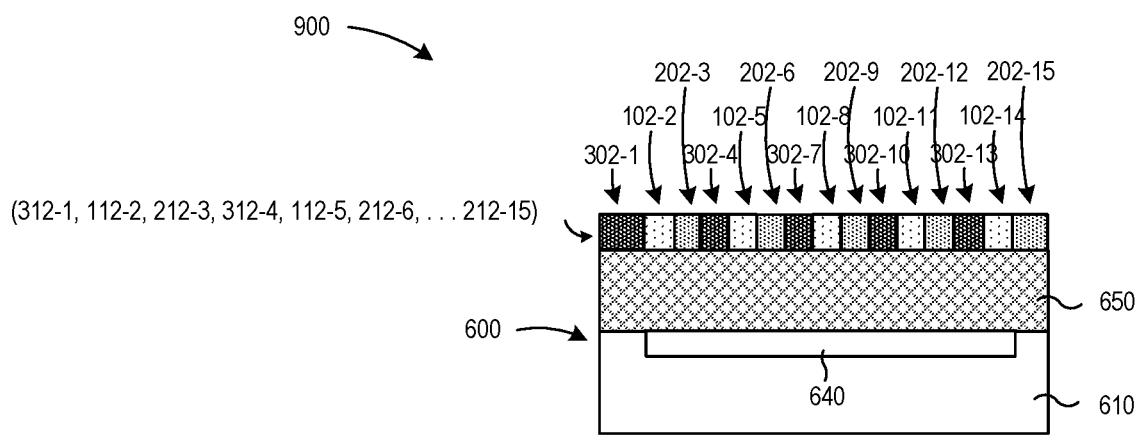

FIGS. 8A, 8B, and 8C schematically illustrate cross-sectional views of first, second, and third slicing wafers 700, 800, and 900, respectively, consistent with an embodiment of the present disclosure. As used herein, a "slicing wafer"

refers to a wafer formed with slices of epitaxial layers on top thereof. As shown in FIGS. 8A, 8B, and 8C, growth substrate slices 112 (112-1, 112-2, . . . 112-15), 212 (212-1, 212-2, . . . 212-15), and 312 (312-1, 312-2, . . . 312-15) have been removed from the wafers shown in FIGS. 7A, 7B, and 7C, to form first slicing wafer 700, second slicing wafer 800, and third slicing wafer 900, respectively.

In particular, as shown in FIG. 8A, first growth substrate slices 112 (112-1, 111-4, 111-7, 112-10, 112-13) in the first subset of first epitaxial wafer slices 102 (102-1, 102-4, 102-7, 102-10, 102-13), second growth substrate slices 212 (212-2, 212-5, 212-8, 212-11, 212-14) in the first subset of second epitaxial wafer slices 202 (202-2, 202-5, 202-8, 202-11, 202-14), and third growth substrate slices 312 (312-3, 312-6, 312-9, 312-12, 312-15) in the first subset of third epitaxial wafer slices 302 (302-3, 302-6, 302-9, 302-12, 302-15) have been removed to expose first epitaxial layer slices 122 (122-1, 122-4, 122-7, 122-10, 122-13), second epitaxial layer slices 222 (222-2, 222-5, 222-8, 222-11, 222-14), and third epitaxial layer slices 322 (322-3, 322-6, 322-9, 322-12, 322-15). First growth substrate slices 112 (112-1, 112-4, 112-7, 112-10, 112-13), second growth substrate slices 212 (212-2, 212-5, 212-8, 212-11, 212-14), and third growth substrate slices 312 (312-3, 312-6, 312-9, 312-12, 312-15) can be removed using any suitable physical or chemical substrate removing technique, such as laser lift-off, chemical-mechanical polishing (CMP), or wet etching.

Similarly, as shown in FIG. 8B, first growth substrate slices 112 (112-3, 112-6, 112-9, 112-12, 112-15) in the second subset of first epitaxial wafer slices 102 (102-3, 102-6, 102-9, 102-12, 102-15), second growth substrate slices 212 (212-1, 212-4, 212-7, 212-10, 212-13) in the second subset of second epitaxial wafer slices 202 (202-1, 202-4, 202-7, 202-10, 202-13), and third growth substrate slices 312 (312-2, 312-5, 312-8, 312-11, 312-14) in the second subset of third epitaxial wafer slices 302 (302-2, 302-5, 302-8, 302-11, 302-14) are removed.

As shown in FIG. 8C, first growth substrate slices 112 (112-2, 112-5, 112-8, 112-11, 112-14) in the third subset of first epitaxial wafer slices 102 (102-2, 102-5, 102-8, 102-11, 102-14), second growth substrate slices 212 (212-3, 212-6, 212-9, 212-12, 212-15) in the third subset of second epitaxial wafer slices 202 (202-3, 202-6, 202-9, 202-12, 202-15), and third growth substrate slices 312 (312-1, 312-4, 312-7, 312-10, 312-13) in the third subset of third epitaxial wafer slices 302 (302-1, 301-4, 302-7, 302-10, 302-13) are removed.

Removal processes that can be used for the growth substrate slices performed on second driver circuit wafer 500 and third driver circuit wafer 600 are similar to the ones performed on first driver circuit wafer 400, and thus detailed descriptions of these processes are not repeated.

After growth substrate slices 112, 212, and 312 are removed, the remaining slicing wafers 700, 800, and 900 are intermediate products formed during the process of forming the micro-LED chip. The structure and processing of first, second, and third slicing wafers 700, 800, and 900 are similar to each other. Therefore, the following description focuses on first slicing wafer 700.

Figure 9:
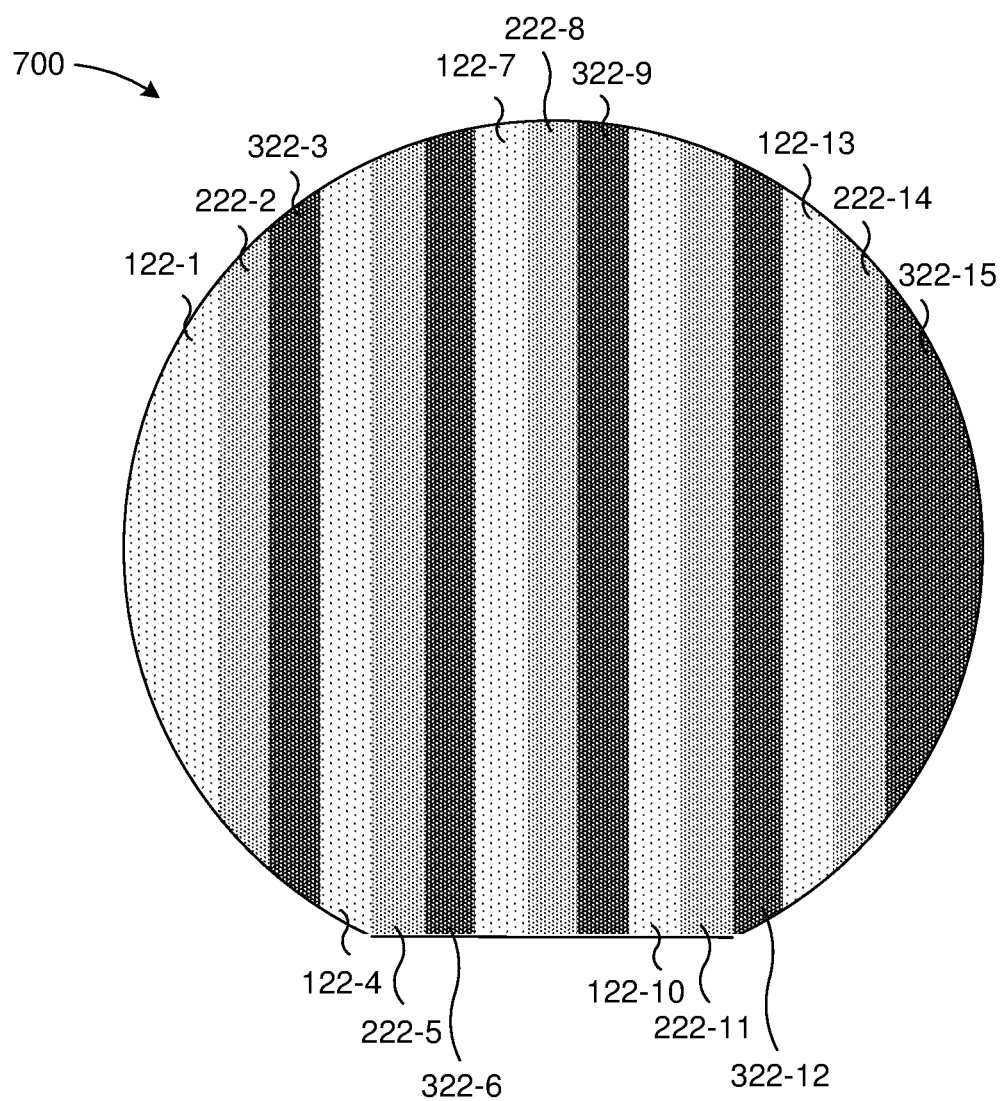
FIG. 9 schematically illustrates a top view of the first slicing wafer of FIG. 8A, consistent with an embodiment of the present disclosure.

FIG. 9 schematically illustrates a top view of first slicing wafer 700. As shown in FIGS. 8A and 9, first slicing wafer 700 includes first driver circuit wafer 400 having first driver circuit substrate 410 and first driver circuit 440 formed on first driver circuit substrate 410, bonding layer 450 formed over first driver circuit wafer 400, and first, second, and third epitaxial layer slices 122 (122-1, 122-4, 122-7, 122-10, 122-13), 222 (222-2, 222-5, 222-8, 222-11, 222-14), and 322 (322-3, 322-6, 322-9, 322-12, 322-15), respectively, alternately formed over unpatterned bonding layer 450. First slicing wafer 700 does not include an epitaxial growth substrate, and therefore first, second, and third epitaxial layer slices 122 (122-1, 122-4, 122-7, 122-10, 122-13), 222 (222-2, 222-5, 222-8, 222-11, 222-14), and 322 (322-3, 322-6, 322-9, 322-12, 322-15) are exposed to the environment.

After first slicing wafer 700 is formed, a patterning process is performed on the plurality of first, second, and third epitaxial layer slices 122, 222, and 322, and bonding layer 450 formed on first slicing wafer 700, to form a plurality of first, second, and third epitaxial layer segments, and a plurality of bonding layer segments. The patterning process may be performed by using photolithography and etching processes. Following the patterning process, semiconductor fabrication processes can be performed to, for example, form electrodes, interconnects, insulation layers, contacts, and/or passivation layers on the first, second, and third epitaxial layer segments, to form a slicing micro-LED wafer including a plurality of micro-LEDs. As used herein, a "slicing micro-LED wafer" refers to a wafer formed with a plurality of micro-LEDs and formed from a slicing wafer.

Figure 10:
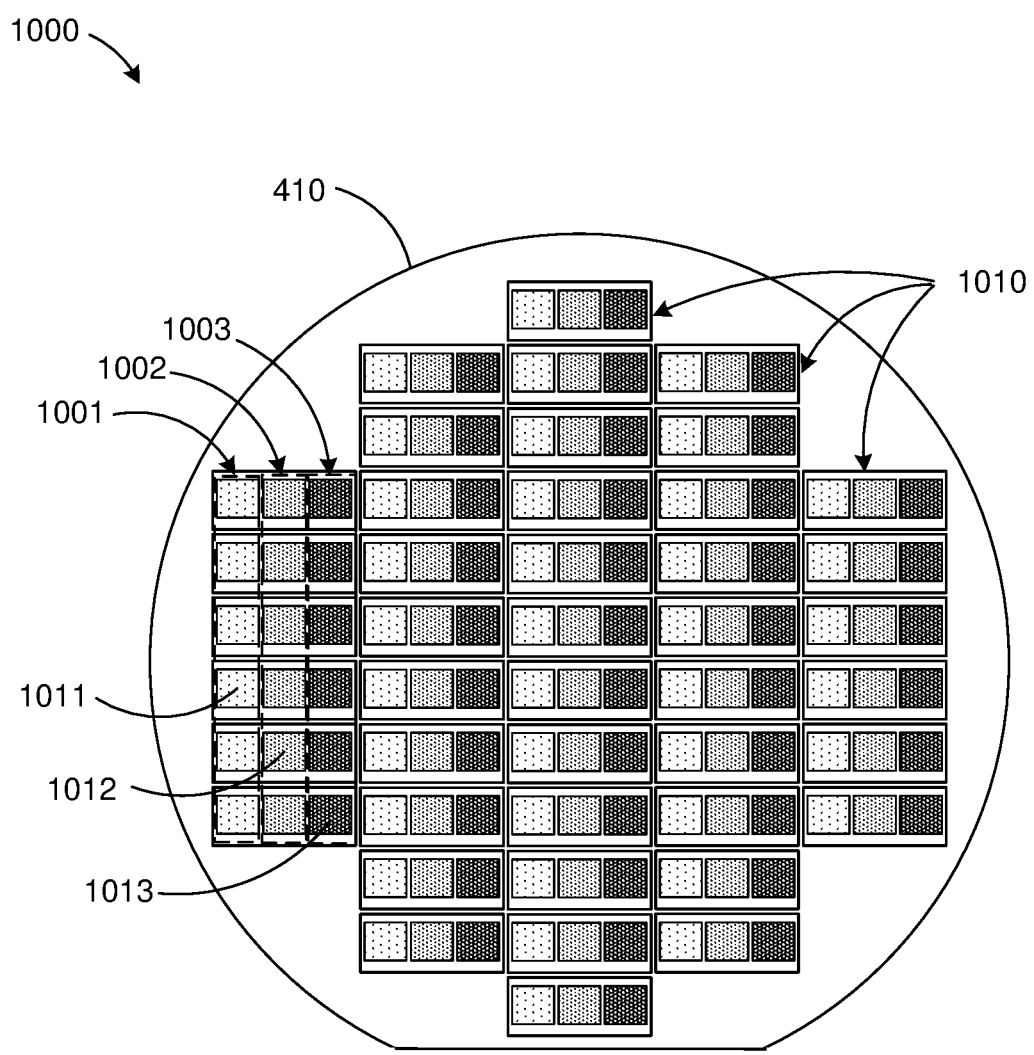
FIG. 10 schematically illustrates a top view of a slicing micro-LED wafer, consistent with an embodiment of the present disclosure.

FIG. 10 schematically illustrates a top view of a slicing micro-LED wafer 1000 made from first slicing wafer 700 illustrated in FIGS. 8A and 9, according to an embodiment of the present disclosure. Slicing micro-LED wafer 1000 made from wafer 700 is exemplary. Slicing micro-LED wafers can similarly be made from slicing wafers 800 and 900.

Slicing micro-LED wafer 1000 includes driver circuit substrate 410, and a plurality of micro-LEDs 1011, 1012, and 1013. Although not shown in FIG. 10, slicing micro-LED wafer 1000 also includes bonding layer 450 (shown in the cross-sectional view illustrated in FIG. 8A). Bonding layer 450 is formed at the bottoms of epitaxial wafer slices 1001, 1002, and 1003 and on a top surface of driver circuit substrate 410, for bonding micro-LEDs 1011, 1012, or 1013 and driver circuit substrate 410.

The plurality of micro-LEDs 1011, 1012, and 1013 are made from a plurality of epitaxial layer slices 1001, 1002, and 1003 arranged side-by-side in an array on driver circuit substrate 410. Each of epitaxial layer slices 1001, 1002, and 1003 is made from first, second, or third epitaxial wafer slices 102, 202, or 302. A shape of each of epitaxial layer slices 1001, 1002, and 1003 is rectangular. The space between the adjacent epitaxial layer slices 1001, 1002, and 1003 is, for example, more than 300 µm.

In some embodiments, bonding layer 450 may be formed from the plurality of epitaxial pre-bonding layer slices each formed at a bottom of a corresponding one of epitaxial layer slices 1001, 1002, and 1003. A shape of each epitaxial pre-bonding layer slice is the same as a shape of a corresponding epitaxial layer slice 1001, 1002, or 1003. The plurality of epitaxial pre-bonding layer slices may be arranged in an array. An array shape of the plurality of epitaxial pre-bonding layer slices is the same as an array shape of the plurality of epitaxial layer slices 1001, 1002, and 1003.

In some embodiments, for example, in the embodiment shown in FIGS. 4A and 5A), bonding layer 450 may be formed from the plurality of epitaxial pre-bonding layer slices each formed at a bottom of a corresponding one of epitaxial layer slices 1001, 1002, and 1003, and first driver circuit pre-bonding layer 430 at a top surface of driver circuit substrate 410. First driver circuit pre-bonding layer 430 is a continuous film.

As described above, each one of first, second, and third epitaxial layers 120, 220, and 320 can, when applied with a voltage, emits light having a certain color. Therefore, each one of first, second, and third micro-LEDs 1011, 1012, and 1013 made from first, second, and third epitaxial layer slices 122, 222, and 322 may be a red LED, a green LED, or a blue LED.

Each one of epitaxial wafer slices 1001, 1002, and 1003 forms an array of micro-LEDs 1011, 1012, or 1013. For example, in the embodiment illustrated in FIG. 10, each one of epitaxial layer slices 1001, 1002, and 1003 forms a single column of micro-LEDs 1011, 1012, or 1013. In particular, a first epitaxial layer slice 1001 forms a single column of first micro-LEDs 1011, a second epitaxial layer slice 1002 forms a single column of second micro-LEDs 1012, and a third epitaxial layer slice 1003 forms a single column of third micro-LEDs 1013. In other embodiments, for example, in the embodiment illustrated in FIGS. 11 and 12 (explained in more detail below), each one of epitaxial layer slices 1001, 1002, and 1003 forms multiple columns of micro-LEDs 1011, 1012, or 1013.

First, second, and third micro-LEDs 1011, 1012, and 1013 constitute a plurality of micro-LED chips 1010. Each micro-LED chip 1010 includes three micro-LEDs arranged in a row direction. Each micro-LED 1011, 1012, or 1013 constitutes a pixel of one micro-LED chip 1010. For example, first micro-LED 1011 constitutes a red pixel of micro-LED chip 1010; second micro-LED 1012 constitutes a green pixel of micro-LED chip 1010; and third micro-LED 1013 constitutes a blue pixel of micro-LED chip 1010.

Figure 11A:
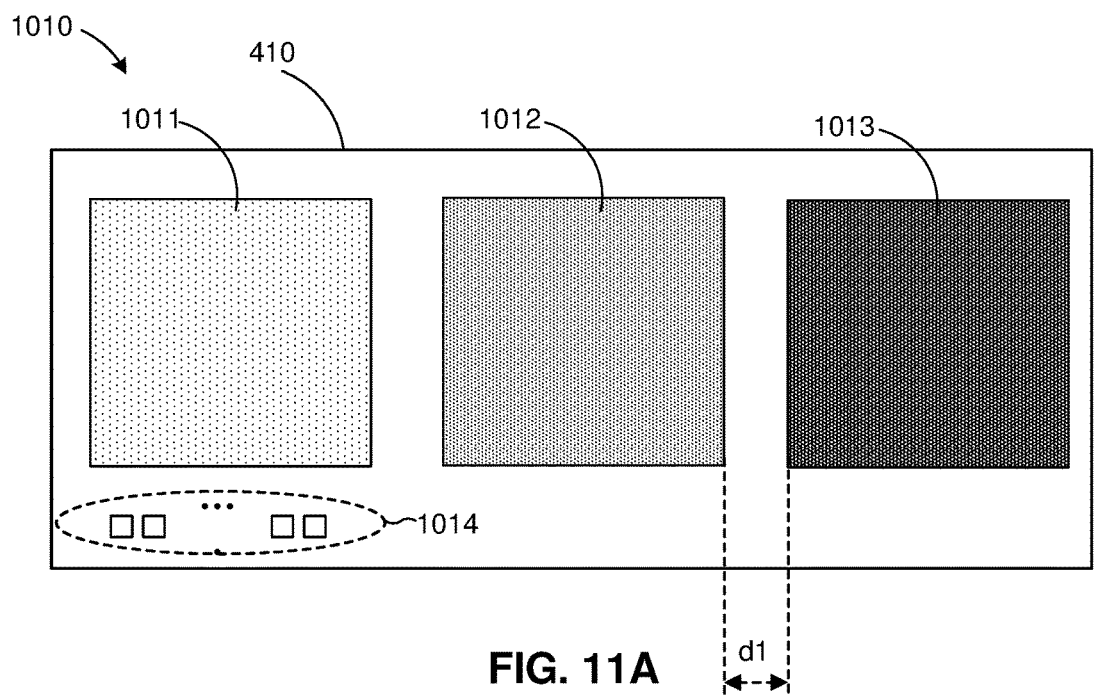
FIG. 11A schematically illustrates a top view of a micro-LED chip made from the slicing micro-LED wafer illustrated in FIG. 10, consistent with an embodiment of the present disclosure.
Figure 11B:
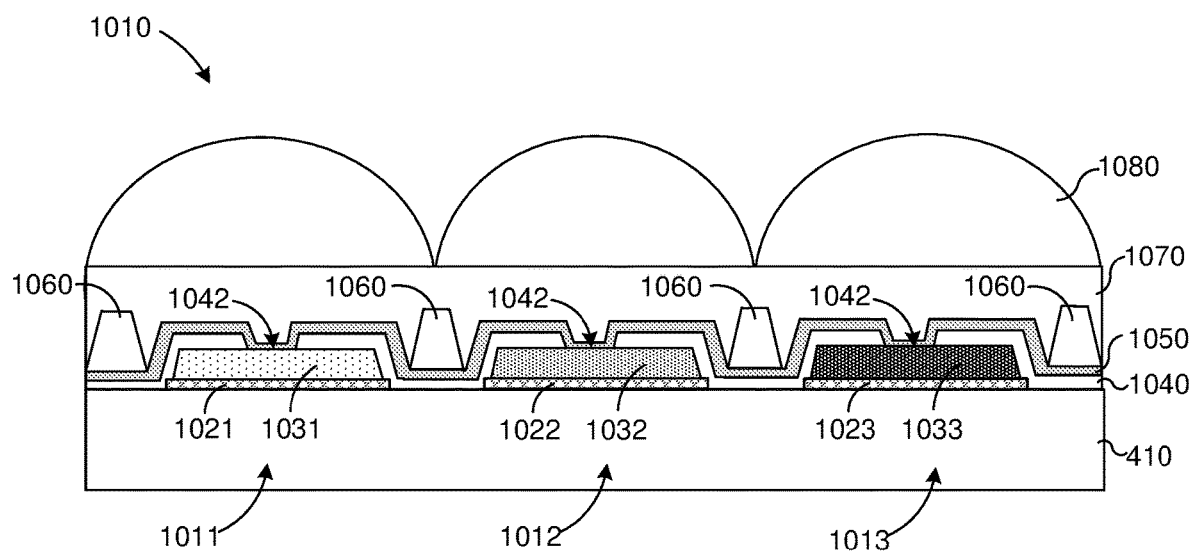
FIG. 11B schematically illustrates a cross-sectional view of the micro-LED chip of FIG. 11A, consistent with an embodiment of the present disclosure FIG. 12 schematically illustrates a top view of a slicing micro-LED wafer, consistent with such an embodiment of the present disclosure.

After micro-LED chips 1010 are formed from slicing micro-LED wafer 1000, each individual micro-LED chip 1010 may be cut off from slicing micro-LED wafer 1000 and packaged. FIG. 11A schematically illustrates a top view of one of micro-LED chips 1010, according to an embodiment of the present disclosure. FIG. 11B schematically illustrates a cross-sectional view of micro-LED chip 1010.

As shown in FIGS. 11A and 11B, micro-LED chip 1010 includes first micro-LED 1011, second micro-LED 1012, third micro-LED 1013, and one or more contact pads 1014 for receiving power and data. First micro-LED 1011, second micro-LED 1012, third micro-LED 1013 are arranged side-by-side on first driver circuit substrate 410. A space d1 between adjacent LEDs is, for example, greater than 300 µm.

First micro-LED 1011 includes, at least, a first bonding layer segment 1021 and a first epitaxial layer segment 1031 disposed on top of first bonding layer segment 1021. Second micro-LED 1012 includes, at least, a second bonding layer segment 1022 and a second epitaxial layer segment 1032 disposed on top of second bonding layer segment 1022. Third micro-LED 1013 includes, at least, a third bonding layer segment 1023 and a third epitaxial layer segment 1033 disposed on top of third bonding layer segment 1023.

Micro-LED chip 1010 also includes an insulating layer 1040 and a transparent conductive layer 1050 covering first micro-LED 1011, second micro-LED 1012, and third micro-LED 1013. Insulating layer 1040 is formed with openings 1042 exposing portions of top surfaces of first epitaxial layer segment 1031, second epitaxial layer segment 1032, and third epitaxial layer segment 1033. Transparent conductive layer 1050 covers insulating layer 1040 and is formed in openings 1042 of insulating layer 1040, thereby contacting the exposed top surfaces of first epitaxial layer segment 1031, second epitaxial layer segment 1032, and third epitaxial layer segment 1033 via openings 1052.

Micro-LED chip 1010 further includes light-isolating walls 1060 arranged on each side of first micro-LED 1011, second micro-LED 1012, and third micro-LED 1013. The height of light-isolating walls 1060 may be greater than or equal to each one of first micro-LED 1011, second micro-LED 1012, and third micro-LED 1013, in order to isolate the light emitted by first micro-LED 1011, second micro-LED 1012, and third micro-LED 1013.

Moreover, micro-LED chip 1010 includes a transparent isolation layer 1070 covering all of first micro-LED 1011, second micro-LED 1012, third micro-LED 1013, insulating layer 1040, transparent conductive layer 1050, and light-isolating walls 1060. In addition, microlenses 1080 are formed on top of each one of first micro-LED 1011, second micro-LED 1012, and third LED micro-1013.

Figure 12:
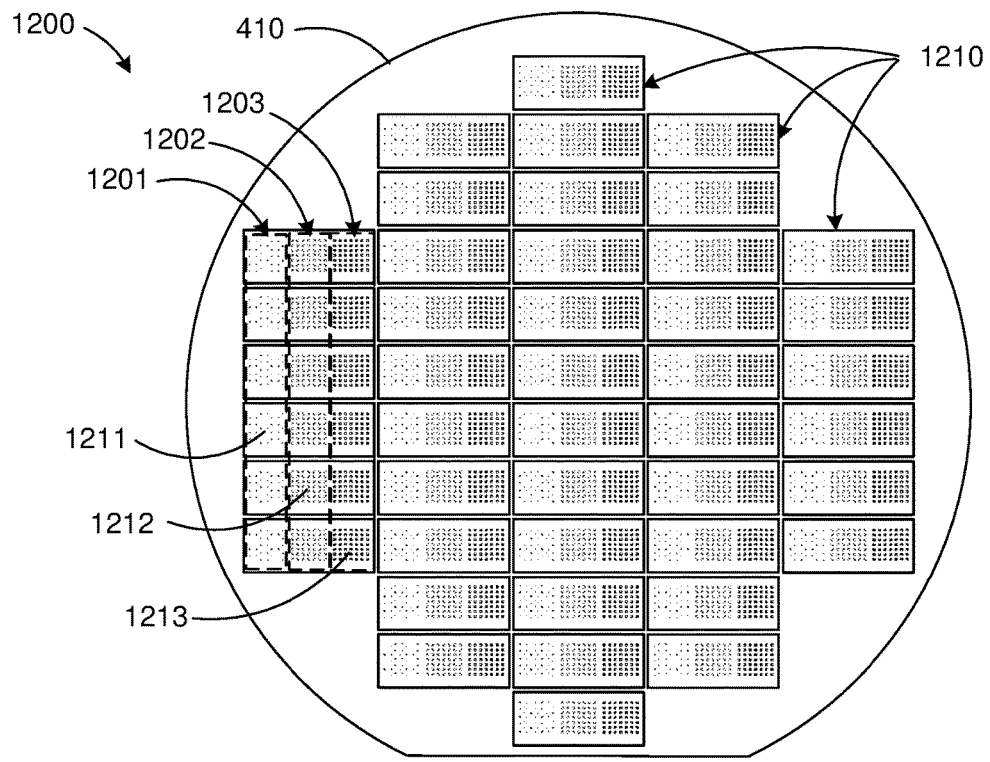
Figure 13:
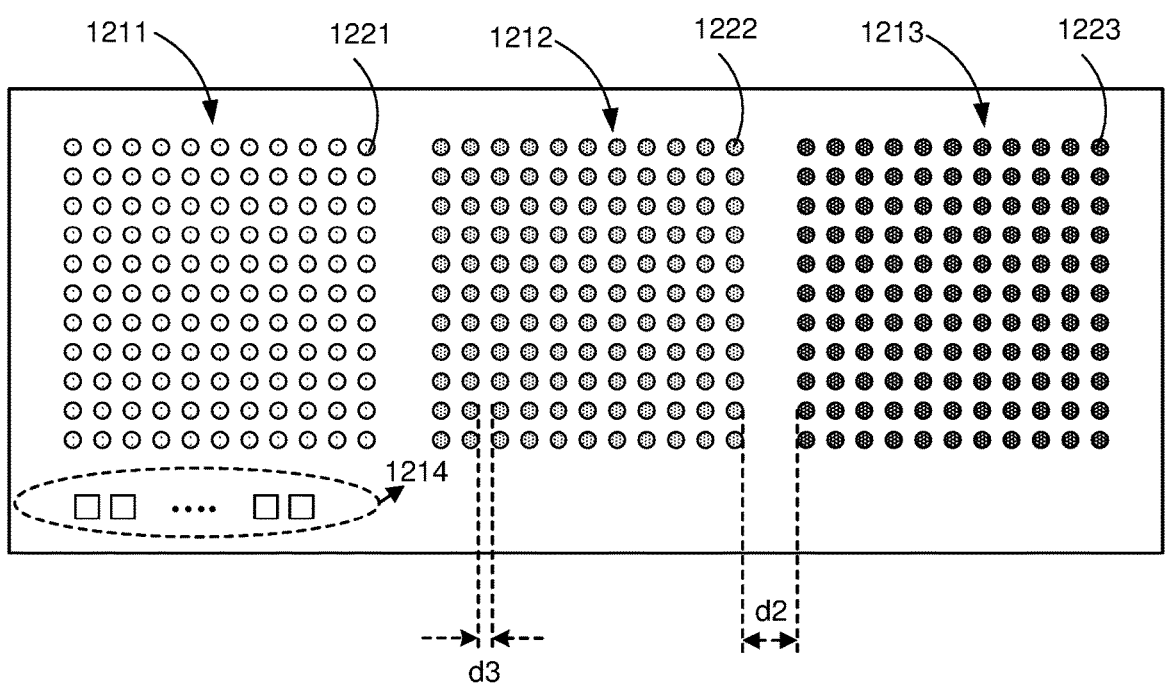
FIG. 13 schematically illustrates a top view of a micro-LED chip made from the slicing micro-LED wafer illustrated in FIG. 12, consistent with an embodiment of the present disclosure.

In the embodiment illustrated in FIG. 10, each one of epitaxial layer slices 1001, 1002, and 1003 forms a single column of micro-LEDs 1011, 1012, or 1013. In some alternative embodiments, each one of epitaxial layer slices may form multiple columns of micro-LEDs. FIG. 12 schematically illustrates a top view of a slicing micro-LED wafer 1200 made from first slicing wafer 700 illustrated in FIGS. 8A and 9, consistent with such an embodiment of the present disclosure. FIG. 13 schematically illustrates a top view of one of a plurality of micro-LED chips 1210 made from slicing micro-LED wafer 1200. Slicing micro-LED wafer 1200 made from wafer 700 is exemplary. Slicing micro-LED wafers can similarly be made from slicing wafers 800 and 900.

As shown in FIG. 12, slicing micro-LED wafer 1200 includes driver circuit substrate 410, and a plurality of first, second, and third micro-LED arrays 1211, 1212, and 1213 formed on driver circuit substrate 410. The plurality of micro-LED arrays 1211, 1212, and 1213 are made from a plurality of epitaxial layer slices 1201, 1202, and 1203 arranged side-by-side in an array on driver circuit substrate 410. Epitaxial layer slices 1201, 1202, and 1203 are made from first, second, and third epitaxial wafer slices 102, 202, and 302, respectively. Each micro-LED array 1211, 1212, or 1213 includes two or more rows and two or more columns of micro-LEDs. The space between the adjacent epitaxial layer slices 1201, 1202, and 1203 is, for example, more than 300 µm.

First, second, and third micro-LED arrays 1211, 1212, and 1213 constitute the plurality of micro-LED chips 1210. As shown in FIG. 12, micro-LED chip 1210 includes a first micro-LED array 1211 including a plurality of first micro-LEDs 1221, a second micro-LED array 1212 including a plurality of second micro-LEDs 1222, a third micro-LED array 1213 including a plurality of third micro-LEDs 1223, and one or more contact pads 1214 for receiving power and data. The structures of first micro-LEDs 1221, second micro-LEDs 1222, and third LEDs micro-1223 are similar to the structures of first micro-LED 1011, second micro-LED 1012, and third micro-LED 1013, respectively, and therefore detailed description of the structures is not repeated.

Each micro-LED array 1211, 1212, or 1213 constitutes a pixel of micro-LED chip 1210. For example, first micro-LED array 1211 constitutes a red pixel of micro-LED chip 1210, second micro-LED array 1212 constitutes a green pixel of micro-LED chip 1210, and third micro-LED array 1213 constitutes a blue pixel of micro-LED chip 1210.

As shown in FIG. 13, a space d2 between adjacent micro-LED arrays is, for example, greater than 300 µm. A space d3 between adjacent LEDs may be less than the distance d2 between adjacent LED arrays.

In the aforementioned embodiments, bonding layer 450 is formed from first, second, and third epitaxial pre-bonding layers 130, 230, and 330, and first driver circuit pre-bonding layer 430. In some alternative embodiments, bonding layer 450 may be formed from a single layer of pre-bonding layer.

For example, bonding layer 450 may be formed from a single layer of first driver circuit pre-bonding layer 430. That is, the process illustrated in FIGS. 2A-2C may be omitted such that first, second, and third epitaxial wafers 100, 200, and 300 do not include first, second, and third epitaxial pre-bonding layers 130, 230, and 330, respectively. Consequently, first, second, and third epitaxial wafer slices 102, 202, and 302 do not include first, second, and third epitaxial pre-bonding layer slices 132, 232, and 332, respectively. In this case, when first, second, and third epitaxial wafer slices 102, 202, and 302 are selectively arranged on first driver circuit wafer 400, first, second, and third epitaxial layer slices 122, 222, and 322 directly contact first driver circuit pre-bonding layer 430. Then, a bonding process is performed. As a result of the bonding process, at least a portion of first driver circuit pre-bonding layer 430 melts at an elevated temperature to bond first, second, and third epitaxial layer slices 122, 222, and 322 with first driver circuit substrate 410.

As another example, bonding layer 450 may be formed from a single layer of epitaxial pre-bonding layer. That is, first driver circuit wafer 400 may be formed without first driver circuit pre-bonding layer 430. In this case, when first, second, and third epitaxial wafer slices 102 (102-1, 102-4, 102-7, 102-10, 102-13), 202 (202-2, 202-5, 202-8, 202-11, 202-14), and 302 (302-3, 302-6, 302-9, 302-12, 302-15) are selectively arranged on first driver circuit wafer 400, first, second, and third epitaxial pre-bonding layer slices 132 (132-1, 132-2, . . . 132-15), 232 (232-1, 232-2, . . . 232-15), and 332 (332-1, 332-2, . . . 332-15) directly contact first driver circuit substrate 410. Then, a bonding process is performed. As a result of the bonding process, at least a portion of first, second, and third epitaxial pre-bonding layer slices 132 (132-1, 132-2, . . . 132-15), 232 (232-1, 232-2, . . . 232-15), and 332 (332-1, 332-2, . . . 332-15) melt at an elevated temperature to bond first, second, and third epitaxial layer slices 122 (122-1, 122-4, 122-7, 122-10, 122-13), 222 (222-2, 222-5, 222-8, 222-11, 222-14), and 322 (322-3, 322-6, 322-9, 322-12, 322-15) with first driver circuit substrate 410.

When bonding layer 450 is formed from a single layer of first, second, and third epitaxial pre-bonding layers 130, 230, and 330 arranged side-by-side, or a single layer of first driver circuit pre-bonding layer 430, bonding layer 450 may be formed relatively thin. The thickness of bonding layer 450 formed from a single layer of pre-bonding layer may be in the range of approximately 0.1 μm to 2.0 μm. For example, the thickness of bonding layer 450 may be 0.2 μm, 0.3 μm, 0.4 μm, or 0.5 μm.

Figure 14:
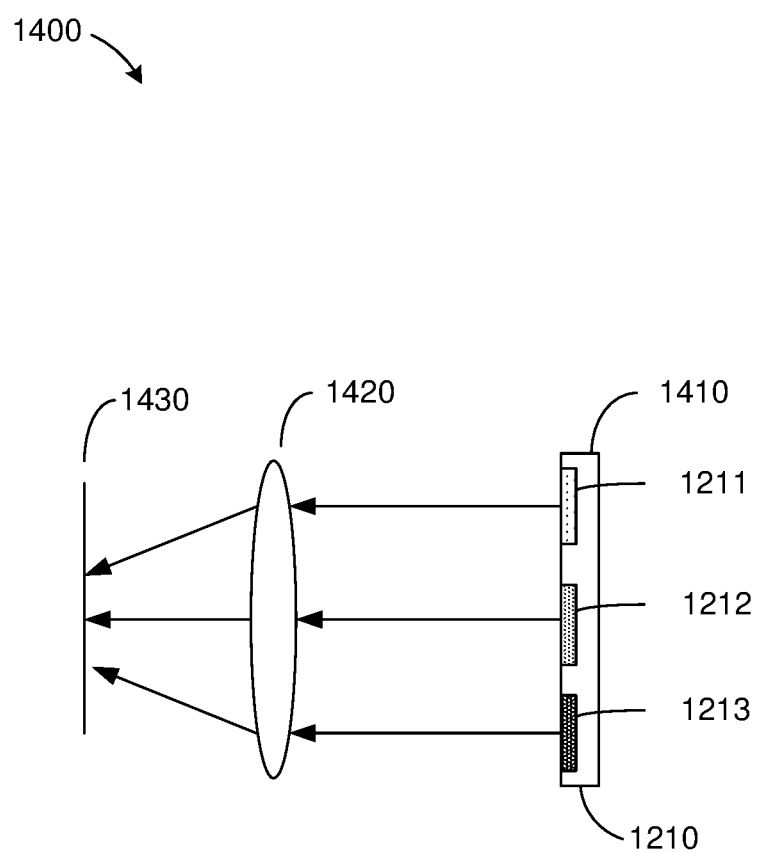
FIG. 14 schematically illustrates a display system, consistent with an embodiment of the present disclosure.

FIG. 14 schematically illustrates a display system 1400, consistent with an embodiment of the present disclosure. Display system 1400 includes a display panel 1410, an optical combining system 1420, and a display interface 1430.

Display panel 1410 includes micro-LED chip 1210 illustrated in FIG. 13. Each one of first, second, and third micro-LED arrays 1211, 1212, and 1213 in micro-LED chip 1210 emits a respective color light representative of an image. That is, first micro-LED array 1211 emits first color light representative of a first color image, second micro-LED array 1212 emits second color light representative of a second color image, and third micro-LED array 1213 emits third color light representative of a third color image.

As described above, first, second, and third micro-LED arrays 1211, 1212, and 1213 are made from epitaxial layer slices 1201, 1202, and 1203, respectively, and epitaxial layer slices 1201, 1202, and 1203 are made from first, second, and third epitaxial wafer slices 102, 202, and 302, respectively. Hereinafter, epitaxial layer slices 1201, 1202, and 1203 are also referred to as first color epitaxial layer slice 1201, second color epitaxial layer slice 1202, and third color epitaxial layer slice 1203.

The different color lights transmit through optical combining system 1420, which combines the different color lights and projects the combined light onto display interface 1430. As a result, a combined image combining the first, second, and third color images is displayed on display interface 1430. The optical combining system 1420 can be a group of optical combining prisms.

Figure 15:
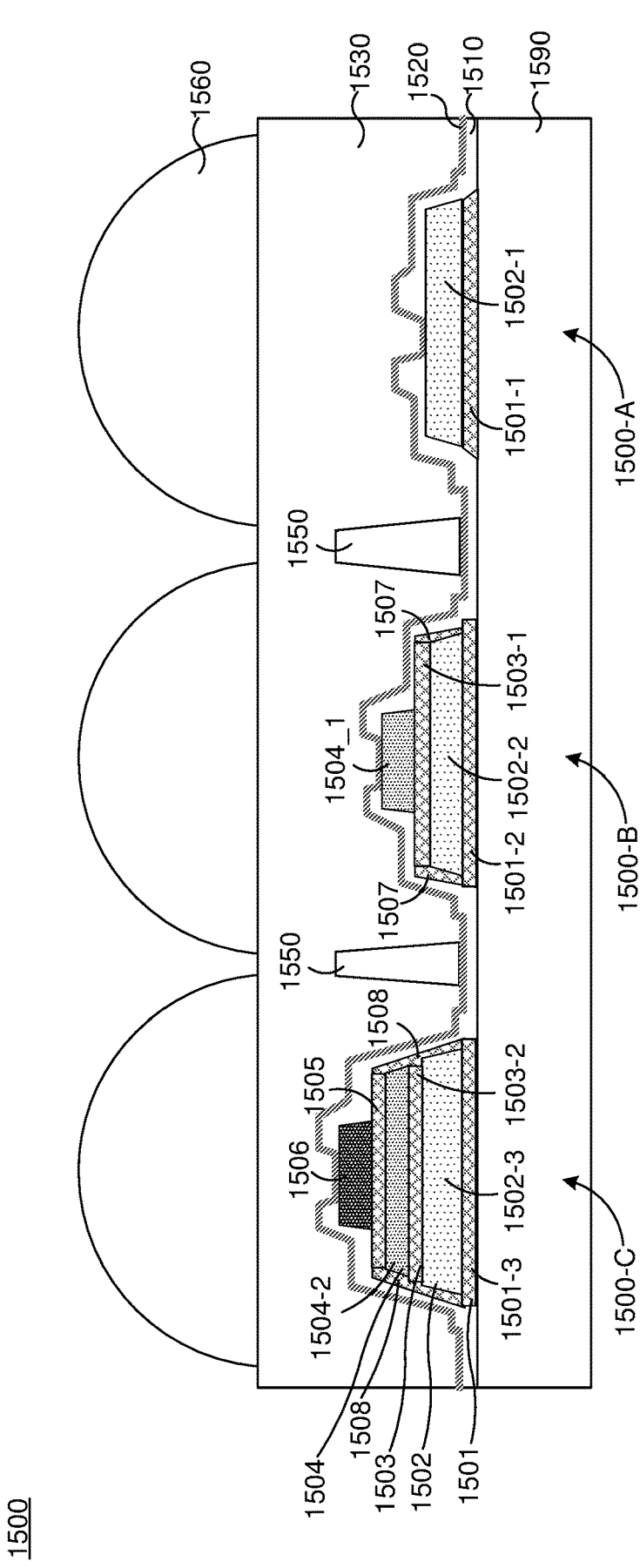
FIG. 15 schematically illustrates a cross-sectional view of a micro-LED chip, consistent with a comparative example.

FIG. 15 schematically illustrates a cross-sectional view of a micro-LED chip 1500, consistent with a comparative example. As shown in the comparative example in FIG. 15, micro-LED chip 1500 includes a first micro-LED 1500-A, a second micro-LED 1500-B, and a third micro-LED 1500-C arranged side-by-side on a driver circuit substrate 1590. First color micro-LED 1500-A includes a first segment 1501-1 of a first metal layer 1501 and a first segment 1502-1 of a first epitaxial layer 1502, in an order from bottom to top as viewed in FIG. 15. Second micro-LED 1500-B includes a second segment 1501-2 of the first metal layer 1501, a second segment 1502-2 of first epitaxial layer 1502, a first segment 1503-1 of a second metal layer 1503, and a first segment 1504-1 of a second epitaxial layer 1504, in an order from bottom to top as viewed in FIG. 15, and at least one first electrical connector 1507 connecting second segment 1501-2 of first metal layer 1501 and first segment 1503-1 of second metal layer 1503. Third micro-LED 1500-C includes a third segment 1501-3 of first metal layer 1501, a third segment 1502-3 of first epitaxial layer 1502, a second segment 1503-2 of second metal layer 1503, a second segment 1504-2 of second epitaxial layer 1504, a third metal layer 1505, and a third epitaxial layer 1506, in an order from bottom to top as viewed in FIG. 15, and at least one second electrical connector 1508 electrically connecting third segment 1501-3 of first metal layer 1501, second segment 1503-2 of second metal layer 1503, and third metal layer 1505.

Similar to micro-LED chip 1010 illustrated in FIG. 11B, micro-LED chip 1500 also includes an insulating layer 1510 and a transparent conductive layer 1520 covering first micro-LED 1500-A, second micro-LED 1500-B, and third micro-LED 1500-C; light-isolating walls 1550 arranged between first micro-LED 1500-A and second micro-LED 1500-B, and between second micro-LED 1500-B and third micro-LED 1500-C; a transparent isolation layer 1530; and microlenses 1560 formed on each one of first micro-LED 1500-A, second micro-LED 1500-B, and third micro-LED 1500-C.

In order to fabricate micro-LED chip 1500, driver circuit substrate 1590 is first bonded with a first epitaxial wafer including a first growth substrate and first epitaxial layer 1502, by using first metal layer 1501 as a bonding layer, and then etching back the first growth substrate to expose first epitaxial layer 1502. Next, substrate 1590 formed with first metal layer 1501 and first epitaxial layer 1502 is bonded with a second epitaxial wafer including a second growth substrate and second epitaxial layer 1504, by using second metal layer 1503 as a bonding layer, and then etching back the second growth substrate to expose second epitaxial layer 1504. Substrate 1590 formed with first metal layer 1501, first epitaxial layer 1502, second metal layer 1503, and second epitaxial layer 1504 is bonded with a third epitaxial wafer including a third growth substrate and third epitaxial layer 1506, and then etching back the third growth substrate to expose third epitaxial layer 1506. Afterwards, first metal layer 1501, first epitaxial layer 1502, second metal layer 1503, and second epitaxial layer 1504 are selectively etched to form first, second, and third micro-LEDs 1500-A, 1500-B, and 1500-C.

Accordingly, the process of fabricating micro-LED chip 1500 of the comparative example involves several steps of bonding driver circuit substrate 1590 and the epitaxial wafers, and several steps of etching back the epitaxial growth substrates in the epitaxial wafers. Thus, the process of fabricating micro-LED chip 1500 is relatively complicated and the resulting micro-LED chip 1500 is relatively thick. In addition, when first metal layer 1501, first epitaxial layer 1502, second metal layer 1503, and second epitaxial layer 1504 are selectively etched to form first, second, and third micro-LEDs 1500-A, 1500-B, and 1500-C, surfaces of first, second, and third epitaxial layer 1502, 1504, and 1506 may be damaged by etching, and thus decrease the quality of micro-LED chip 1500.

In contrast to the comparative example illustrated in FIG. 15, in the process of fabricating micro-LED chip 1010 or 1210 according to the aforementioned embodiments of the present application, first, second, and third epitaxial layers 120, 220, and 320 are grown on first, second, and third epitaxial growth substrates 110, 210, and 310, and then first, second, and third epitaxial layers 120, 220, and 320 are sliced and selectively transferred over and bonded with first driver circuit wafer 400 (or similarly with second driver wafer 500 or third driver wafer 600). Because a single bonding process is used to bond first, second, and third epitaxial pre-bonding layers 130, 230, and 330 with first driver circuit wafer 400 (or similarly with second driver wafer 500 and third driver wafer 600), the process for fabricating micro-LED chip 1010 or 1210 is less complex than the process of the comparative example, and the resulting micro-LED chip 1010 or 1210 is relatively thin.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A slicing micro-light emitting diode (LED) wafer, comprising:
  a driver circuit substrate;
  a plurality of epitaxial layer slices arranged side-by-side on the driver circuit substrate;
  a plurality of micro-LEDs formed on the driver circuit substrate, the plurality of micro-LEDs including portions of the plurality of epitaxial layer slices arranged side-by-side on the driver circuit substrate; and
  a bonding layer, formed between the plurality of epitaxial layer slices and the driver circuit substrate, for bonding the micro-LEDs and the driver circuit substrate,
  wherein a space between adjacent ones of the micro-LEDs is less than a space between adjacent epitaxial layer slices.

2. The slicing micro-LED wafer according to claim 1, wherein an array of the micro-LEDs includes portions of one of the plurality of epitaxial layer slices.

3. The slicing micro-LED wafer according to claim 1, wherein one of the plurality of epitaxial layer slices is configured to emit one color light, and another one of the plurality of epitaxial layer slices adjacent to the one epitaxial layer slice is configured to emit a different color light.

4. The slicing micro-LED wafer according to claim 1, wherein the micro-LEDs including portions of the same sliced epitaxial layer are configured to emit a same color light.

5. The slicing micro-LED wafer according to claim 1, wherein the plurality of epitaxial layer slices include a first epitaxial layer slice configured to emit a first color, a second epitaxial layer slice configured to emit a second color, and a third color epitaxial layer slice configured to emit a third color,
  the first color epitaxial layer slice, the second epitaxial layer slice, and the third color epitaxial layer slice are arranged side by side to form a display panel.

6. The slicing micro-LED wafer according to claim 1, wherein the plurality of epitaxial layer slices include a first epitaxial layer slice configured to emit a first color and a second epitaxial layer slice configured to emit a second color,
  the first epitaxial layer slice and the second epitaxial layer slice are arranged side by side to form a display panel.

7. The slicing micro-LED wafer according to claim 1, wherein each of the plurality of micro-LEDs is a red LED, a green LED, or a blue LED.

8. The slicing micro-LED wafer according to claim 1, wherein a pixel is formed by an array of the micro-LEDs, or one of the micro-LEDs.

9. The slicing micro-LED wafer according to claim 1, wherein the space between the adjacent epitaxial layer slices is more than 300 µm.

10. The slicing micro-LED wafer according to claim 1, wherein a shape of each of the plurality of epitaxial layer slices is rectangular.

11. The slicing micro-LED wafer according to claim 1, wherein the plurality of epitaxial layer slices are arranged in an array.

12. The slicing micro-LED wafer according to claim 1, wherein the bonding layer includes portions of a plurality of epitaxial pre-bonding layer slices each formed at a bottom of a corresponding one of the plurality of epitaxial layer slices, and a shape of each epitaxial pre-bonding layer slice is the same as a shape of the corresponding epitaxial layer slice.

13. The slicing micro-LED wafer according to claim 12, wherein the plurality of epitaxial pre-bonding layer slices are arranged in an array.

14. The slicing micro-LED wafer according to claim 13, wherein an array shape of the plurality of epitaxial pre-bonding layer slices is the same as an array shape of the plurality of epitaxial layer slices.

15. The slicing micro-LED wafer according to claim 1, wherein respective thicknesses of the plurality of epitaxial layer slices are the same.

16. The slicing micro-LED wafer according to claim 1, wherein the bonding layer includes portions of a plurality of epitaxial pre-bonding layer slices each formed at a bottom of a corresponding one of the epitaxial layer slices, and a driver circuit pre-bonding layer at a top surface of the driver circuit substrate.

17. The slicing micro-LED wafer according to claim 16, wherein a shape of each of the plurality of epitaxial prebonding layer slices is the same as a shape of a corresponding one of the plurality of epitaxial layer slices.

18. The slicing micro-LED wafer according to claim 16, wherein the driver circuit pre-bonding layer is a continuous film.

19. A slicing micro-light emitting diode (LED) wafer, comprising:
- a driver circuit substrate;
- a plurality of epitaxial layer slices arranged side-by-side on the driver circuit substrate;
- a plurality of micro-LEDs formed on the driver circuit substrate, the plurality of micro-LEDs including portions of the plurality of epitaxial layer slices arranged side-by-side on the driver circuit substrate; and
- a bonding layer, formed between the plurality of epitaxial layer slices and the driver circuit substrate, for bonding the micro-LEDs and the driver circuit substrate,
- wherein an array of the micro-LEDs includes portions of one of the plurality of epitaxial layer slices.

* * * * *